United States Patent
Serra et al.

(10) Patent No.: US 12,401,364 B2
(45) Date of Patent: Aug. 26, 2025

(54) MULTIPLE PARTITIONS IN A DATA PROCESSING ARRAY

(71) Applicant: Xilinx, Inc., San Jose, CA (US)

(72) Inventors: Juan J. Noguera Serra, San Jose, CA (US); Tim Tuan, San Jose, CA (US); Javier Cabezas Rodriguez, Austin, TX (US); David Clarke, Dublin (IE); Peter McColgan, North Dublin (IE); Zachary Blaise Dickman, Dublin (IE); Saurabh Mathur, Saratoga, CA (US); Amarnath Kasibhatla, Sunnyvale, CA (US); Francisco Barat Quesada, Dublin (IE)

(73) Assignee: Xilinx, Inc., San Jose, CA (US)

( * ) Notice: Subject to any disclaimer, the term of this patent is extended or adjusted under 35 U.S.C. 154(b) by 0 days.

(21) Appl. No.: 18/509,128

(22) Filed: Nov. 14, 2023

(65) Prior Publication Data
US 2024/0088900 A1    Mar. 14, 2024

Related U.S. Application Data

(62) Division of application No. 17/659,423, filed on Apr. 15, 2022, now Pat. No. 11,848,670.

(51) Int. Cl.
*H03K 19/177* (2020.01)
*G11C 5/02* (2006.01)
(Continued)

(52) U.S. Cl.
CPC ......... *H03K 19/1776* (2013.01); *G11C 5/025* (2013.01); *H03K 19/17764* (2013.01); *H03K 19/17784* (2013.01)

(58) Field of Classification Search
None
See application file for complete search history.

(56) References Cited

U.S. PATENT DOCUMENTS

| | | |
|---|---|---|
| 2,204,687 A | 6/1940 | Little |
| 3,776,137 A | 12/1973 | Abbott |

(Continued)

FOREIGN PATENT DOCUMENTS

| | | |
|---|---|---|
| WO | 2019195132 | 10/2019 |
| WO | 2019195309 | 10/2019 |
| WO | 2019195343 | 10/2019 |

OTHER PUBLICATIONS

Mellanox, "Bluefield Multicore System on Chip," copyright 2017, 4 pp., Mellanox Technologies, Sunnyvale, California, USA.

(Continued)

*Primary Examiner* — Anh Q Tran
(74) *Attorney, Agent, or Firm* — Kevin T. Cuenot

(57) ABSTRACT

An apparatus includes a data processing array having a plurality of array tiles. The plurality of array tiles include a plurality of compute tiles. The compute tiles include a core coupled to a random-access memory (RAM) in a same compute tile and to a RAM of at least one other compute tile. The data processing array is subdivided into a plurality of partitions. Each partition includes a plurality of array tiles including at least one of the plurality of compute tiles. The apparatus includes a plurality of clock gate circuits being programmable to selectively gate a clock signal provided to a respective one of the plurality of partitions.

11 Claims, 19 Drawing Sheets

(51) Int. Cl.
  *H03K 19/17704*  (2020.01)
  *H03K 19/17736*  (2020.01)
  *H03K 19/1776*   (2020.01)
  *H03K 19/17764*  (2020.01)
  *H03K 19/17784*  (2020.01)

(56) References Cited

U.S. PATENT DOCUMENTS

| | | | |
|---|---|---|---|
| 4,876,641 A | 10/1989 | Cowley | |
| 6,091,263 A | 7/2000 | New et al. | |
| 6,092,174 A * | 7/2000 | Roussakov | G06F 15/7867 |
| | | | 712/15 |
| 6,150,839 A | 11/2000 | New et al. | |
| 6,204,687 B1 | 3/2001 | Schultz et al. | |
| 6,462,579 B1 | 10/2002 | Camilleri et al. | |
| 6,526,557 B1 | 2/2003 | Young et al. | |
| 6,759,869 B1 | 7/2004 | Young et al. | |
| 6,781,407 B2 | 8/2004 | Schultz | |
| 6,810,514 B1 | 10/2004 | Alfke et al. | |
| 6,836,842 B1 | 12/2004 | Guccione et al. | |
| 6,907,595 B2 | 6/2005 | Curd et al. | |
| 7,024,651 B1 | 4/2006 | Camilleri et al. | |
| 7,057,413 B1 | 6/2006 | Young et al. | |
| 7,124,338 B1 | 10/2006 | Mark et al. | |
| 7,185,309 B1 | 2/2007 | Kulkarni et al. | |
| 7,199,608 B1 | 4/2007 | Trimberger | |
| 7,224,184 B1 | 5/2007 | Levi et al. | |
| 7,281,093 B1 | 10/2007 | Kulkarni et al. | |
| 7,301,822 B1 | 11/2007 | Walstrum, Jr. et al. | |
| 7,302,625 B1 | 11/2007 | Payakapan et al. | |
| 7,328,335 B1 | 2/2008 | Sundararajan et al. | |
| 7,380,035 B1 | 5/2008 | Donlin | |
| 7,394,288 B1 | 7/2008 | Agarwal | |
| 7,420,392 B2 | 9/2008 | Schultz et al. | |
| 7,454,658 B1 | 11/2008 | Baxter | |
| 7,477,072 B1 | 1/2009 | Kao et al. | |
| 7,478,357 B1 | 1/2009 | Mason et al. | |
| 7,482,836 B2 | 1/2009 | Levi et al. | |
| 7,500,060 B1 | 3/2009 | Anderson et al. | |
| 7,509,617 B1 | 3/2009 | Young | |
| 7,518,396 B1 | 4/2009 | Kondapalli et al. | |
| 7,521,961 B1 | 4/2009 | Anderson | |
| 7,539,845 B1 | 5/2009 | Wentzlaff et al. | |
| 7,546,572 B1 | 6/2009 | Ballagh et al. | |
| 7,574,680 B1 | 8/2009 | Kulkarni et al. | |
| 7,576,561 B1 | 8/2009 | Huang | |
| 7,619,442 B1 | 11/2009 | Mason et al. | |
| 7,640,527 B1 | 12/2009 | Dorairaj et al. | |
| 7,650,248 B1 | 1/2010 | Baxter | |
| 7,653,820 B1 | 1/2010 | Trimberger | |
| 7,689,726 B1 | 3/2010 | Sundararajan et al. | |
| 7,724,815 B1 | 5/2010 | Raha et al. | |
| 7,746,099 B1 | 6/2010 | Chan et al. | |
| 7,774,579 B1 | 8/2010 | Wentzlaff | |
| 7,788,625 B1 | 8/2010 | Donlin et al. | |
| 7,831,801 B1 | 11/2010 | Anderson | |
| 8,001,266 B1 | 8/2011 | Gonzalez | |
| 8,006,021 B1 | 8/2011 | Li et al. | |
| 8,020,163 B2 | 9/2011 | Nollet et al. | |
| 8,045,546 B1 | 10/2011 | Bao et al. | |
| 8,102,188 B1 | 1/2012 | Chan et al. | |
| 8,214,694 B1 | 7/2012 | McKechnie et al. | |
| 8,250,342 B1 | 8/2012 | Kostamov et al. | |
| 8,359,448 B1 | 1/2013 | Neuendorffer | |
| 8,415,974 B1 | 4/2013 | Lysaght | |
| 8,656,141 B1 | 2/2014 | Agarwal | |
| 8,719,750 B1 | 5/2014 | Balzli, Jr. | |
| 8,796,539 B2 | 8/2014 | Asaumi et al. | |
| 8,928,351 B1 | 1/2015 | Konduru | |
| 9,081,634 B1 | 7/2015 | Simkins et al. | |
| 9,152,794 B1 | 10/2015 | Sanders et al. | |
| 9,165,143 B1 | 10/2015 | Sanders et al. | |
| 9,218,443 B1 | 12/2015 | Styles et al. | |
| 9,230,112 B1 | 1/2016 | Peterson et al. | |
| 9,323,876 B1 | 4/2016 | Lysaght et al. | |
| 9,336,010 B2 | 5/2016 | Kochar et al. | |
| 9,411,688 B1 | 8/2016 | Poolla et al. | |
| 9,436,785 B1 | 9/2016 | Javre | |
| 9,639,487 B1 | 5/2017 | Wentzlaff | |
| 9,652,252 B1 | 5/2017 | Kochar et al. | |
| 9,652,410 B1 | 5/2017 | Schelle et al. | |
| 9,722,613 B1 | 8/2017 | Schultz et al. | |
| 9,990,241 B2 | 6/2018 | Dobbs | |
| 10,243,882 B1 | 3/2019 | Swarbrick | |
| 10,505,548 B1 | 12/2019 | Swarbrick | |
| 10,673,439 B1 | 6/2020 | Ahmad | |
| 10,673,745 B2 | 6/2020 | Swarbrick | |
| 10,747,690 B2 | 8/2020 | Bilski | |
| 10,824,505 B1 | 11/2020 | Swarbrick | |
| 10,824,584 B1 | 11/2020 | Noguera Serra | |
| 10,838,908 B2 | 11/2020 | Swarbrick | |
| 10,866,753 B2 | 12/2020 | Noguera Serra et al. | |
| 10,963,421 B1 | 3/2021 | Swarbrick | |
| 11,336,287 B1 | 5/2022 | Rodriguez | |
| 11,494,331 B2 * | 11/2022 | Master | G06F 7/5443 |
| 2004/0114609 A1 | 6/2004 | Swarbrick et al. | |
| 2004/0210695 A1 | 10/2004 | Weber et al. | |
| 2007/0006137 A1 | 1/2007 | Savagaonkar | |
| 2007/0124565 A1 * | 5/2007 | Jones | G06F 15/17337 |
| | | | 712/201 |
| 2008/0082759 A1 | 4/2008 | Pong | |
| 2008/0320255 A1 | 12/2008 | Wingard et al. | |
| 2008/0320268 A1 | 12/2008 | Wingard et al. | |
| 2012/0036296 A1 | 2/2012 | Wingard et al. | |
| 2012/0310983 A1 | 12/2012 | Mittal | |
| 2014/0006751 A1 | 1/2014 | Aliseychik et al. | |
| 2014/0267334 A1 | 9/2014 | Duluk, Jr. | |
| 2016/0011996 A1 | 1/2016 | Asaad et al. | |
| 2017/0140800 A1 | 5/2017 | Wingard et al. | |
| 2017/0220499 A1 | 8/2017 | Gray | |
| 2017/0315944 A1 | 11/2017 | Mayer et al. | |
| 2018/0012637 A1 | 1/2018 | Krishna | |
| 2019/0155666 A1 | 5/2019 | Dobbs | |
| 2019/0205263 A1 | 7/2019 | Fleming | |
| 2019/0205269 A1 | 7/2019 | Fleming, Jr. | |
| 2019/0238453 A1 | 8/2019 | Swarbrick et al. | |
| 2019/0266125 A1 | 8/2019 | Swarbrick et al. | |
| 2019/0303033 A1 | 10/2019 | Noguera Serra et al. | |
| 2019/0303311 A1 | 10/2019 | Bilski et al. | |
| 2019/0303323 A1 | 10/2019 | Swarbrick et al. | |
| 2019/0303328 A1 | 10/2019 | Bilski et al. | |
| 2022/0286135 A1 * | 9/2022 | Pope | H03K 19/17748 |

OTHER PUBLICATIONS

Mellanox, "NP-5 Network Processor," copyright 2107, 2 pp., Mellanox Technologies, Sunnyvale, California, USA.

Mellanox, "Tile-Gx672 Processor," PB041, Feb. 14, 2015, 2 pp., Mellanox Technologies, Sunnyvale, California, USA.

Kalray, "Kalray NVMe-oF Target Controller Solutions," Dec. 18, 2017, 14 pp., Kalray Inc., Los Altos, California, USA.

Ezchip, "Tile-Gx72 Processor," PB041, Feb. 14, 2015, 2 pp., EZchip Semiconductor, Inc., San Jose, California, USA.

Schooler, Richard, "Tile Processors: Many-Core for Embedded and Cloud Computing," Sep. 15, 2010, 35 pp., 14th Annual Workshop on High Performance Embedded Computing {HPEC '10).

Doud, Bob, "Accelerating the Data Plane with the Tile-Mx Manycore Processor," Feb. 25, 2015, 19 pp., Linley Data Center Conference, EZchip Semiconductor, Inc., San Jose, California, USA.

Nentzlaff, David et al., "On-Chip Interconnection Architecture of the Tile Processor," IEEE Micro, Nov. 12, J007, pp. 15-31, vol. 27, Issue 5, IEEE Computer Society Press, Los Alamitos, California, USA.

Kalray, "MPPA Processors for Autonomous Driving," May 25, 2017, 18 pp., Kalray Inc., Los Altos, California, USA.

Kalray, "Deep Learning for High-Performance Embedded Applications," 19 pp., Kalray Inc., Los Altos, California, USA.

Xilinx, UltraScale Architecture DSP Slice, UG579, Oct. 18, 2017, 74 pp., Xilinx, Inc., San Jose, California, USA.

Xilinx, Inc., "AXI4-Stream Interconnect v1.1, LogiCORE IP Product Guide," PG035, Vivado Design Suite, Chap. 2: Product

(56) References Cited

OTHER PUBLICATIONS

Specification, Chap. 3: Designing With the Core, Oct. 4, 2017, 44 pg., Xilinx, Inc., San Jose, California, USA.
Stocksdale et al., Architecting H BM as a High Bandwidth, High Capacity, Self-Managed Last-Level Cache, Nov. 2017, PDSW-DSICS' 17 Denver, Co, USA (Year: 2017).
Arm Limited, "AMBA 3 APB Protocol Specification," v1.0, Sep. 25, 2003, pp. 1-34, ARM Limited, Cambridge, UK.
Arm Limited, "AMBA 4 Axis-Stream Protocol SpecificaTIon," V1.0, Mar. 3, 2010, pp. 1-42, ARM Limited, Cambridge UK.
Xilinx, Inc., "Zynq-7000 AP SoC—32 Bit DDR Access with ECC Tech Tip," 15 pg., printed on Aug. 10, 2018, <http://www.wiki.xilinx.com/Zynq-7000+AP+XoC+-+32+Bit+DDR+Access+with+ECC+Tech+Tip>, San Jose, CA, USA.
Dally, William J. et al., "Deadlock=Free Message Routing in Multiprocessor Interconnection Networks," IEEE Transactions on Computers, May 1987, pp. 547-553, vol. C-36, No. 5, IEEE, Piscataway, New Jersey, USA.
Glass, Christopher et al., "The Turn Model for Adaptive Routing," Journal of the Association for Computing Machinery, Sep. 1994, pp. 874,902, vol. 41, No. 5, ACM, New York, New York, USA.
ARM Limited, "AMBA AXI and ACE Protocol Specification," Jun. 16, 2003, pp. 1-306, ARM Limited, Cambridge, UK.
Rantala, Ville et al., "Network on Chip R outing Algorithms," TUCS Technical Report No. 779, Aug. 2006, pp. 1-38, Turku Centre for Computer Science, Turku, Finland.
TIS Committee, Tool Interface Standard (TIS) Executable and Linking Format (ELF) Specification, Version 1.2, May 1995, 106 pg, Tool Interface Standard Committee.
Wentzlaff, David, et al., "On-Chip Interconnection Architecture of the Tile Processor," IEEE MICRO, Nov. 12, 2007, pp. 15-31, vol. 27, Issue 5, IEEE Computer Society Press, Los Alamitos, California, USA.
LogiCORE IP AXI Interconnect (v1.06.a), Product Specification, DS768, Dec. 18, 2012, 62 pg., Xilinx, Inc., San Jose, California.
Xilinx, Inc., "Versal: The First Adaptive Compute Acceleration Platform (ACAP)," WP505 (v1.1.1) Sep. 29, 2020, 21 pages.
Xilinx, Inc., "Xilinx AI Engines and Their Applications," WP506 (v1.1) Jul. 10, 2020, 13 pages.

\* cited by examiner

US 12,401,364 B2

MULTIPLE PARTITIONS IN A DATA PROCESSING ARRAY

TECHNICAL FIELD

This disclosure relates to integrated circuits (ICs) and, more particularly, to a data processing array within an IC that is capable of implementing a plurality of different partitions.

BACKGROUND

Integrated circuits (ICs) have evolved over time to provide increasingly sophisticated computing architectures. While some ICs utilize computing architectures that include a single processor, others include multiple processors. Still, other ICs include multiple processors arranged in an array. Such ICs are capable of providing significant computational power and a high degree of parallelism that extends well beyond the capabilities of single-processor architectures and even multi-core processor architectures.

SUMMARY

In one or more example implementations, an apparatus includes a data processing (DP) array having a plurality of array tiles. Each array tile can include a random-access memory (RAM) having a local memory interface accessible by circuitry within the array tile and an adjacent memory interface accessible by circuitry disposed within an adjacent array tile. Each adjacent memory interface of each array tile can include isolation logic that is programmable to prevent the circuitry disposed within the adjacent array tile from accessing the RAM via the adjacent memory interface. The DP array can be subdivided into a plurality of partitions wherein the isolation logic of the adjacent memory interfaces is programmed to prevent array tiles from accessing RAMs across a boundary between the plurality of partitions.

In one or more example implementations, an apparatus includes a DP array having a plurality of array tiles. The plurality of array tiles include a plurality of compute tiles. Each compute tile can include a core coupled to a RAM in a same compute tile and to a RAM of at least one other compute tile. The DP array is subdivided into a plurality of partitions. Each partition can include a plurality of array tiles including at least one of the plurality of compute tiles. The apparatus can include a plurality of clock gate circuits. Each clock gate circuit is programmable to selectively gate a clock signal provided to a respective one of the plurality of partitions.

In one or more example implementations, an apparatus includes a DP array having a plurality of array tiles. The plurality of array tiles can include a plurality of compute tiles. Each compute tile can include a core coupled to a RAM in a same compute tile and to a RAM of at least one other compute tile. The DP array can be subdivided into a plurality of partitions. Each partition can include a plurality of array tiles including at least one of the plurality of compute tiles. Each partition is a separate power domain that may be powered on and off independently of other ones of the plurality of partitions.

This Summary section is provided merely to introduce certain concepts and not to identify any key or essential features of the claimed subject matter. Other features of the inventive arrangements will be apparent from the accompanying drawings and from the following detailed description.

BRIEF DESCRIPTION OF THE DRAWINGS

The inventive arrangements are illustrated by way of example in the accompanying drawings. The drawings, however, should not be construed to be limiting of the inventive arrangements to only the particular implementations shown. Various aspects and advantages will become apparent upon review of the following detailed description and upon reference to the drawings.

DETAILED DESCRIPTION

Figure 1:
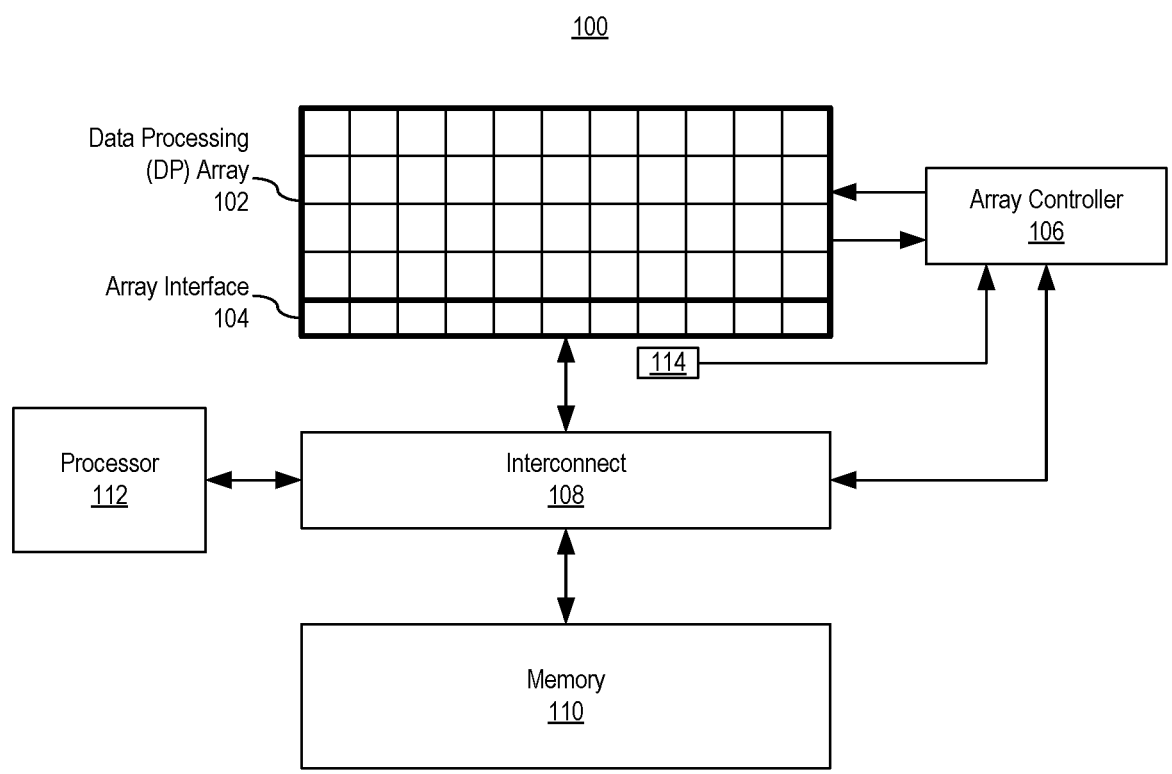
FIG. 1 illustrates an example electronic system including a data processing (DP) array.

This disclosure relates to integrated circuits (ICs) and, more particularly, to a data processing (DP) array that includes a plurality of different partitions within an IC. The DP array may include a plurality of tiles such as compute tiles and/or a mix of compute tiles and memory tiles. The DP array is configurable to perform desired computational activities by loading configuration data into the DP array. Once configured, the DP array is able to perform computational activities. The configuration data loaded into the DP array may specify a variety of operational parameters of the DP array including, but not limited to, particular kernels to be executed by the compute tiles, connectivity between the various tiles of the DP array, and the like.

In one or more examples, the DP array may be partitioned into two or more, e.g., a plurality, of different partitions. Rather than executing a single, larger application using the entirety of the DP array, partitioning allows the DP array to be subdivided into two or more separate and independent portions. Each partition is capable of executing a different and independent application. Safeguards may be implemented as part of the partitioning that prevents a first application executing in a first partition of the DP array from interfering with the execution of a second application executing in a second partition of the DP array. An example of interference between partitions that would be unacceptable and likely to cause an error would be the first application executing in the first partition reading information from a memory disposed in the second partition. The first application may obtain incorrect data or the privacy of the data of the second application may be compromised. Another example of interference between partitions that would be unacceptable and likely to cause an error would be the first application executing in the first partition writing information to a memory disposed in the second partition. In that case, the operation of the second application may be compromised since data needed by the second application may be corrupted by virtue of the first application's write operation.

In one or more examples, the partitioning may support clock management features on a per-partition basis. For example, each partition may receive a clock signal. The clock signal provided to each partition may be managed (e.g., gated or throttled) as deemed appropriate during runtime of the IC. The term "runtime" means the period during which one or more applications are executing in respective partitions of the DP array. Runtime occurs subsequent to the loading of configuration data to implement or load an application within the DP array or partition thereof. The clock provided to each partition may be managed independently of the clock signal provided to each of the other partitions. In one or more other examples, clock management for the partitions of the DP array may include changing the frequency of the clock signal that is provided to one or more of the partitions during runtime of the IC. By providing clock management on a per-partition basis, the IC including the DP array may consume significantly less power than would be the case were the DP array to be clocked as a single, monolithic system. Through partition-based clock management, those partitions that are not in use or that do not need to operate using a higher frequency clock may be gated or use a lower frequency clock. Similarly, those partitions that do have a need to operate at an increased speed may operate with a higher clock frequency.

In one or more other examples, the partitioning may support power management features on a per-partition basis. For example, each partition may receive a power signal. The power signal provided to each partition may be effectively disconnected from the partition as deemed appropriate during operation of the IC. The power provided to each partition may be managed independently of the other partitions. By providing power management on a per-partition basis, the IC including the DP array may consume significantly less power than would be the case were the DP array to be powered on and off as a single, monolithic system. Through partition-based power management, those partitions that are not in use may be powered off.

FIG. 1 illustrates an example electronic system (system) 100. System 100 includes a DP array 102, an array interface 104, an array controller 106, an interconnect 108, a memory 110, and a processor 112.

In one or more example implementations, system 100 is implemented entirely within a single IC. System 100 may be implemented within a single IC package. In one aspect, system 100 is implemented using a single die disposed in a single IC package. In another aspect, system 100 is implemented using two or more interconnected dies disposed within the single IC package.

In one or more other example implementations, DP array 102, array interface 104, array controller 106, interconnect 108, and processor 112 are implemented in a same IC, while memory 110 is external to the IC. In one or more other example implementations, both memory 110 and processor 112 are external to the IC. For example, memory 110 may be disposed on a same circuit board or card as the IC including DP array 102 and array interface 104, while processor 112 is included in a host data processing system. As an illustrative and non-limiting example, the processor 112 may be included in a host computer in which an IC including the DP array 102 and array interface 104 are disposed on a card installed in an available bus slot of the host computer.

DP array 102 is formed of a plurality of circuit blocks referred to as tiles. In some cases, tiles of DP array 102 are also referred to as "array tiles." Array tiles of DP array 102 may include only compute tiles or a mixture of compute tiles and memory tiles. Compute tiles and memory tiles are hardwired and are programmable. Array interface 104 includes a plurality of interface tiles that allow array tiles of DP array 102 to communicate with circuits outside of DP array 102, whether such circuits are disposed in the same die, a different die in the same IC package, or external to the IC package. Interface tiles are hardwired and programmable.

Array controller 106 is communicatively linked to DP array 102 and to array interface 104. In one aspect, array controller 106 is dedicated to controlling operation of DP array 102 and array interface 104. Array controller 106 may be implemented as a state machine (e.g., a hardened controller) or as a processor. Whether implemented as a state machine or a processor, array controller 106 may be implemented as a hardwired circuit block or using programmable logic.

Interconnect 108 is coupled to array interface 104, array controller 106, processor 112, and memory 110. Interconnect 108 may be implemented as an on-chip interconnect. An example of an on-chip interconnect is an Advanced Microcontroller Bus Architecture (AMBA) eXtensible Interface (AXI) bus. An AXI bus is an embedded microcontroller bus interface for use in establishing on-chip connections between circuit blocks and/or systems. Other example implementations of interconnect 108 may include, but are not limited to, other buses, crossbars, Network-on-Chips (NoCs), and so forth. For purposes of illustration, interconnect 108 may include, or be coupled to, a memory controller that is capable of reading and/or writing memory 110.

Memory 110 may be implemented as a random-access memory (RAM). In one or more example implementations, memory 110 may be implemented, e.g., embedded, in the same IC including DP array 102. Memory 110, for example, may be a RAM circuit implemented on the same die as DP array 102 or on a different die within the same IC package. Memory 110, for example, may be implemented as a High Bandwidth Memory (HBM). In another aspect, memory 110 is external to the IC including DP array 102. For example, memory 110 may be one or more RAM modules communicatively linked to the IC including DP array 102 (e.g., located on a same circuit board as the IC).

In one aspect, processor 112 is implemented, e.g., embedded, in the same IC including DP array 102. Processor 112 may be implemented as a hardwired processor within the IC or implemented using programmable logic. In another aspect, processor 112 is external to the IC including DP array 102. In that case, processor 112 may be part of another data processing system (e.g., a host computer) that is communicatively linked to the IC including DP array 102.

In the example of FIG. 1, DP array 102 and array interface 104 may operate under control of another circuit. That is, another circuit such as processor 112 and/or array controller 106 may control the configuration of DP array 102 and/or array interface 104 over time. In the case where system 100 includes both processor 112 and array controller 106, processor 112 may execute an application and provide instructions, e.g., tasks or jobs, to array controller 106. Array controller 106 may execute the instructions to control configuration and/or operation of DP array 102. In other arrangements, array controller 106 may be omitted such that processor 112 controls configuration and/or operation of DP array 102. In that case, processor 112, when implemented in the same IC as DP array 102 and array interface 104, may include one or more direct connections to DP array 102 and/or array interface 104.

In the example of FIG. 1, the electronic system may include one or more temperature sensors 114. In the example of FIG. 1, a single temperature sensor 114 is shown below array interface 104. In other examples, additional temperature sensors 114 may be included. The temperature sensor(s) 114 may be disposed proximate (e.g., within a predetermined distance of a perimeter or edge) of DP array 102 and/or array interface 104. In another example, temperature sensors 114 may be disposed within tiles of DP array 102 and/or array interface 104 or between such tiles.

As shown, temperature sensor 114 may be coupled to array controller 106. Array controller may include or store a predetermined temperature threshold to which the temperature from temperature sensor 114 may be compared. Array controller 106 is capable of applying one or more of the various clock and/or power gating techniques described herein in response to the comparison of the temperature reading from the temperature sensor 114 with the predetermined temperature threshold. This allows array controller 106 to regulate the temperature of DP array 102 and/or the IC in which DP array 102 is disposed. The control of clock and/or power gating may be performed for the entire DP array 102 or for one or more selected partitions thereof.

Figure 2:
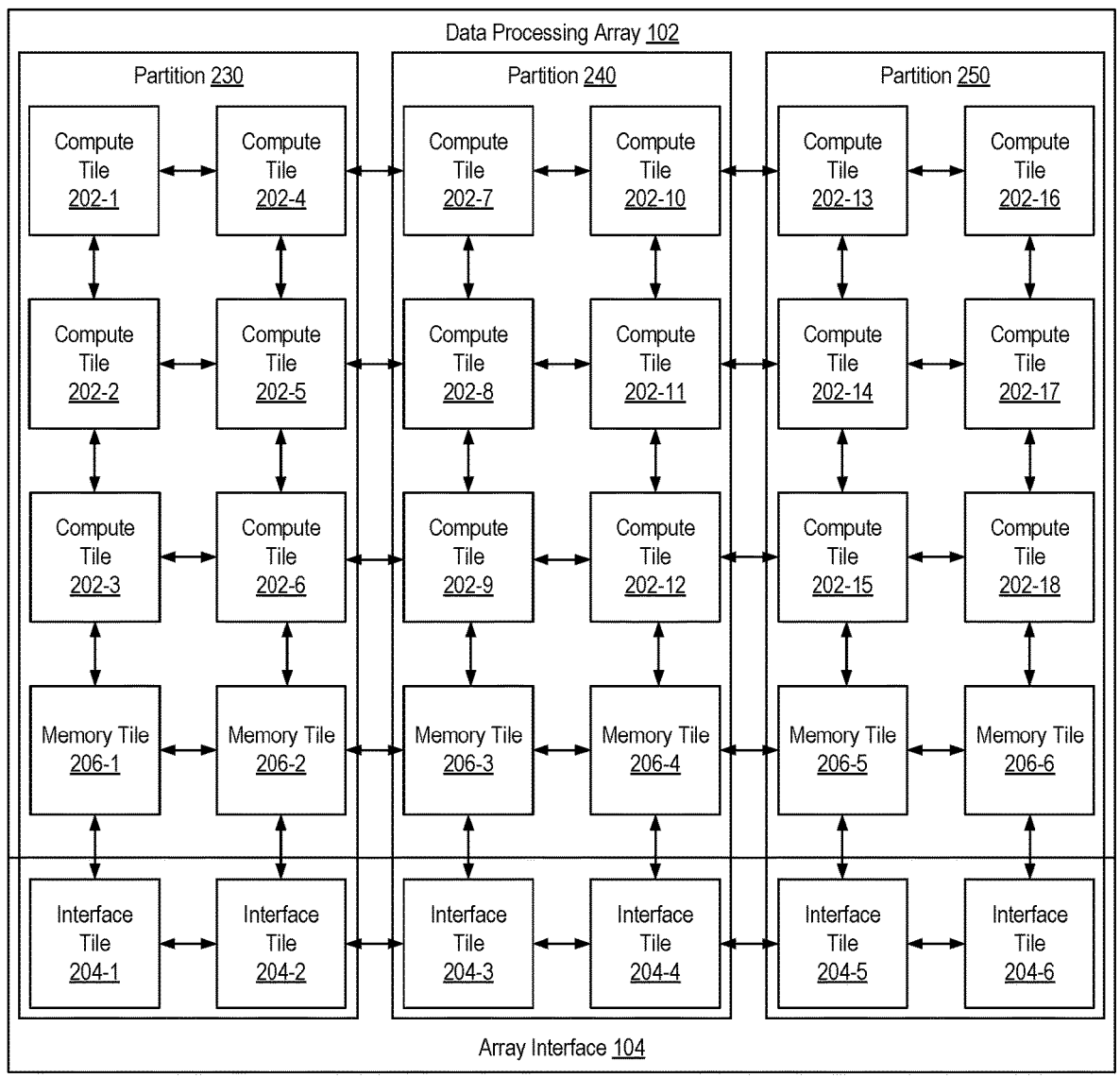
FIG. 2 illustrates an example implementation of a DP array and an array interface.

FIG. 2 illustrates an example implementation of DP array 102 and array interface 104. In the example, DP array 102 includes compute tiles 202 and memory tiles 206. In the example of FIG. 2, compute tiles 202 and memory tiles 206 are arranged in a grid having a plurality of rows and columns. Interface tiles 204 are arranged in a row where the individual tiles 204 are aligned with the columns of the grid arrangement of DP array 102. Compute tiles 202 include compute tiles 202-1, 202-2, 202-3, 202-4, 202-5, 202-6, 202-7, 202-8, 202-9, 202-10, 202-11, 202-12, 202-13, 202-14, 202-15, 202-16, 202-17, and 202-18. Interface tiles 204 include interface tiles 204-1, 204-2, 204-3, 204-4, 204-5, and 204-6. Memory tiles 206 include memory tiles 206-1, 206-2, 206-3, 206-4, 206-5, and 206-6.

Within this disclosure, the term "tile" as used in reference to DP array 102 and/or array interface 104, refers to compute tiles 202, interface tiles 204, and/or to memory tiles 206. The term "array tile" means a compute tile 202 and/or a memory tile 206. The term "interface tile" means an interface tile 204. In the example, each tile is coupled to an adjacent tile to the left (west), right (east), above (north), and below (south) if a tile is located in such position(s).

The example of FIG. 2 is provided for purposes of illustration only. The number of tiles in a given column and/or row, the number of tiles included in DP array 102 and/or array interface 104, the sequence or order of tile types (e.g., memory and compute tiles) in a column and/or row is for purposes of illustration and not limitation. Other arrangements may be included with varying numbers of tiles, rows, columns, mixtures of tile types, and the like. For example, rows of FIG. 2 are homogeneous in terms of tile type while columns are not. In other arrangements, rows may be heterogeneous in terms of tile type while columns are homogeneous. Further, additional rows of memory tiles 206 may be included in DP array 102. Such rows of memory tiles 206 may be grouped together without intervening rows of compute tiles 202 or distributed throughout DP array 102 such that rows of compute tiles 202 do intervene between rows or groups of rows of memory tiles 206.

In another example implementation of DP array 102, memory tiles 206 may be omitted such that the bottom row of compute tiles 202 couples directly to interface tiles 204. In such cases, the various example implementations described herein may read data from and write data to memory 110 in lieu of memory tiles 206.

For purposes of illustration, DP array 102 is subdivided or organized into a plurality of partitions 230, 240, and 250. In the example of FIG. 2, three partitions are shown. It should be appreciated that DP array 102 and array interface 104 may be subdivided into as few as two partitions or more than three partitions. An actual DP array 102, for example, may include hundreds of array tiles thereby allowing the creation of many more partitions.

In the example, the boundary between partitions is illustrated as being vertical along column boundaries. In other arrangements, partition boundaries may be organized along different boundaries (e.g., horizontal) to facilitate the creation of partitions of different geometric shapes. Further, in the example of FIG. 2, partitions are shown to be uniform in size and include two columns of array tiles and two interface tiles. In one or more other examples, partitions may include fewer tiles such as a single column or more tiles such as three or more columns. In one or more other examples, partitions may be of different sizes (e.g., non-uniform in shape).

For purposes of illustration, consider the case where DP array 102 is used to execute more than one application. Each of partitions 230, 240, and 250 may execute a different application without interference from the other partitions. Further, the particular application executed in each of the partitions 230, 240, and/or 250 may be changed to a different application over time as the IC operates. The boundaries between partitions may be preserved to enforce isolation between partitions. For example, communication between tiles that span a partition boundary is not permitted. In illustration, compute tiles 202-4 and 202-7, being located in different partitions, are unable to communicate (e.g., pass data) with one another. Memory tile 206-2 and memory tile 206-3, being located in different partitions, are unable to communicate with one another. Similarly, interface tile 204-2 and interface tile 204-3, being located in different partitions, are unable to communicate with one another.

Figure 3:
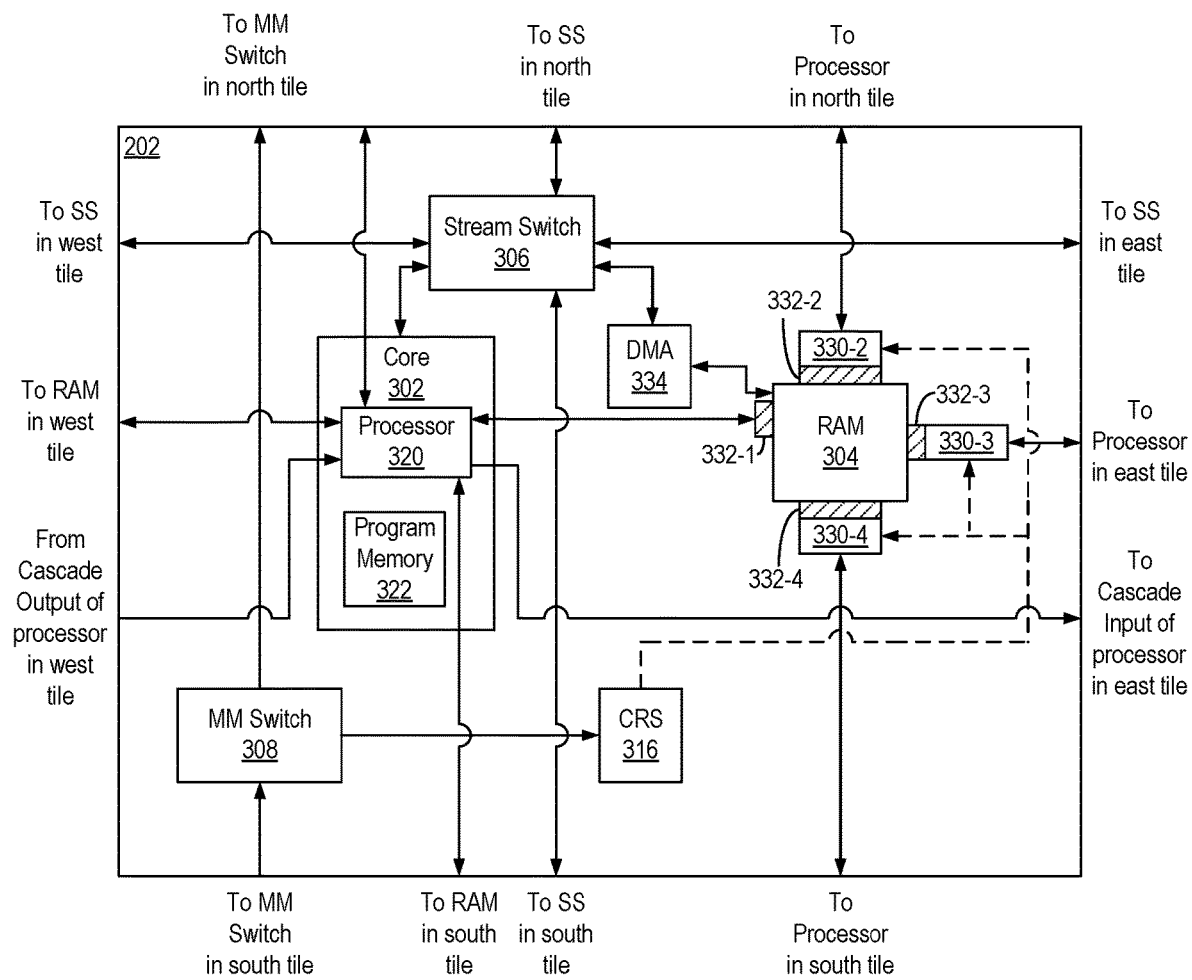
FIG. 3 illustrates an example implementation of a compute tile that is configurable to implement partition boundaries.

FIG. 3 illustrates an example implementation of a compute tile 202. The example of FIG. 3 is provided to illustrate certain architectural features of compute tiles 202 and not as a limitation of the form of DP array 102. Some connections between components and/or tiles are omitted for ease of illustration.

In the example, each compute tile 202 includes a core 302, a random-access memory (RAM) 304, a stream switch 306, and a memory map (MM) switch 308. Core 302 includes a processor 320 and a program memory 322. Compute tile 202 further includes a set of control registers (CRS) 316. Processor 320 may be any of a variety of different processor types. In one aspect, processor 320 is implemented as a vector processor. Program memory 322 may be loaded, e.g., by way of loading configuration data, with one or more sets of executable instructions called "kernels." Compute tiles 202 are capable of performing data processing operations and operating on a large amount of data through execution of the kernels.

Each core 302, e.g., processor 320, is directly connected to the RAM 304 located in the same compute tile 202 through a memory interface 332 (e.g., local memory interface 332-1). Within this disclosure, memory interfaces 332-1 and 332-7 are referred to as "local memory interfaces" since the memory interfaces 332-1 and 332-7 are used by circuits in the same tile to access a RAM. By comparison, memory interfaces 332-2, 332-3, 332-4, 332-4, 332-5, and 332-6 are referred to as "adjacent memory interfaces" as such memory interfaces are used by circuitry in another adjacent tile to access a RAM. As such, each processor 320 is capable of accessing RAM 304 in the same compute tile 202. Processor 320 is capable of executing program code stored in program memory 322. RAM 304 is configured to store application data. Each of RAMs 304 may include a direct memory access (DMA) circuit 334 that is capable of reading and writing data to the RAM 304 located in the same compute tile 202. The DMA circuit 334 may receive data via stream switch 306 and store such data in RAM 304 and/or output data read from RAM 304 over stream switch 306.

Each core 302, e.g., processor 320, may be directly connected to RAM 304 located in adjacent compute tiles 202 (e.g., in the north, south, east, and/or west directions). As such, processor 320 may directly access such other adjacent RAMs 304 in the same manner as processor 320 is able to access the RAM 304 located in the same compute tile 202 without initiating read or write transactions over stream switch 306 and/or without using a DMA circuit. As an illustrative example, processor 320 of compute tile 202-5 may read and/or write directly to the RAM 304 located in compute tiles 202-5, 202-2, 202-4, and 202-6 without submitting read or write transactions over stream switches 306. It should be appreciated, however, that a processor 320 may initiate read and write transactions to the RAM 304 of any other compute tile 202 and/or memory tile 206 via stream switches 306.

Processors 320 may also include direct connections, referred to as cascade connections, to processors 320 of adjacent cores. The example of FIG. 3 illustrates a cascade connection from the west tile to processor 320 and a cascade connection from processor 320 to the cascade input of the processor in the east tile. Cascade connections allow a processor 320 to directly share data from an internal register with another processor 320 without having to write such data to a RAM 304. For example, data from one or more internal registers (e.g., an accumulation register) of processor 320 may be written to another processor 320 without first writing such data to RAM 304 and/or conveying such data over stream switches 306. Though cascade connections are shown in rows of tiles, in other examples, cascade connections may connect a processor 320 to another processor of a tile in the north, south, east, and/or west directions. In an example, processors 320 of tiles may be connected in a serial chain. In still other examples, processors 320 may have cascade connections to two or more other processors 320.

In the example of FIG. 3, RAM 304 may be accessed by processors 320 in the same compute tile and processors 320 in other adjacent tiles via one or more adjacent memory interfaces 332-2, 332-3, and 332-4. In the example, each memory interface 332 that is coupled to a processor 320 that is not located in the same compute tile 202, but rather in an adjacent or neighboring compute tile includes isolation logic 330 (e.g., each adjacent memory interface). Thus, adjacent memory interface 332-2 is operatively coupled to isolation logic 330-2, adjacent memory interface 332-3 is operatively coupled to isolation logic 330-3, and adjacent memory interface 332-4 is operatively coupled to isolation logic 330-4. Isolation logic 330 may be activated by way of a control signal from control registers 316 to prevent the processor coupled thereto from accessing (e.g., reading from and/or writing to) RAM 304. In the example, each of the memory interfaces 332 and the DMA circuit 334 may be coupled to arbitration logic that is included in RAM 304.

For example, isolation logic 330-2 may be activated by writing configuration data to control registers 316 via memory-mapped switch 308. When activated, isolation logic 330-2 prevents the processor 320 in the north compute tile from reading from and/or writing to RAM 304 via adjacent memory interface 332-2. Isolation logic 330-3 may be activated by writing configuration data to control registers 316 via memory-mapped switch 308. When activated, isolation logic 330-3 prevents the processor 320 in the east compute tile from reading from and/or writing to RAM 304 via adjacent memory interface 332-3. Isolation logic 330-4 may be activated by writing configuration data to control registers 316 via memory-mapped switch 308. When activated, isolation logic 330-4 prevents the processor 320 in the south compute tile from reading from and/or writing to RAM 304 via adjacent memory interface 332-4. It should be appreciated that each of isolation logic 330-2, 330-3, and 330-4 may be controlled, e.g., activated and deactivated, independently of the others. By controlling which adjacent processors 320 is/are capable of accessing any given RAM 304 of a compute tile, partitions may be created that guarantee data isolation among partitions.

In the example of FIG. 3, control registers 316 may control operation of other components included in compute tile 202 such as stream switch 306. That is, configuration data may be written to control registers 316 that configures stream switch 306 of FIG. 3 to communicate with only designated tiles. Thus, though stream switch 306 may be physically connected to other stream switches in the north, south, east, and west tiles, the configuration data specifies those tiles with which stream switch 306 may establish a logical connection and, as such communicate by way of stream connections. This too establishes data isolation for a partition.

Consider an example where the compute tile of FIG. 3 is compute tile 202-5. By writing appropriate configuration data to control registers 316, processor 320 of compute tile 202-8 is unable to read and/or write to RAM 304 of compute tile 202-5. The processor 320 of compute tile 202-4 and the processor 320 of compute tile 202-6 are allowed to read and/or write from RAM 304 of compute tile 202-5. Similarly, stream switch 306 of compute tile 202-5 is capable of communicating with the stream switches 306 of compute tiles 202-4, 202-2, and 202-6, but not with the stream switch of compute tile 202-8.

To the extent that the processor 320 of compute tile 202-5 has a direct connection, e.g., a cascade connection, with other processors 320, those cascade connections that do not cross the partition boundary may be allowed (e.g., enabled) while those cascade connections that do cross the partition boundary are not allowed (e.g., are disabled). In one aspect, a cascade connection may be disabled by the application executing in the partition. That is, the kernel program code stored in program memory 322, when executed, does not read and/or write to the cascade connection registers of the processor 320 thereby turning the cascade connection(s) off. Similarly, a cascade connection may be enabled by using kernel program code that does read and/or write to a particular cascade connection register within the processor 320.

In the example of FIG. 3, the array controller 106, though not shown, is capable of writing configuration data to the control registers 316 via memory-mapped switch 308. Array controller 106 is capable of writing to control registers 316 in real-time during operation of DP array 102 to modify the settings for the isolation logic 330, update settings for stream switches 306, and/or change the application executing in a given partition (e.g., by writing new kernels to be executed to the respective program memories 322 of the compute tiles).

Figure 4:
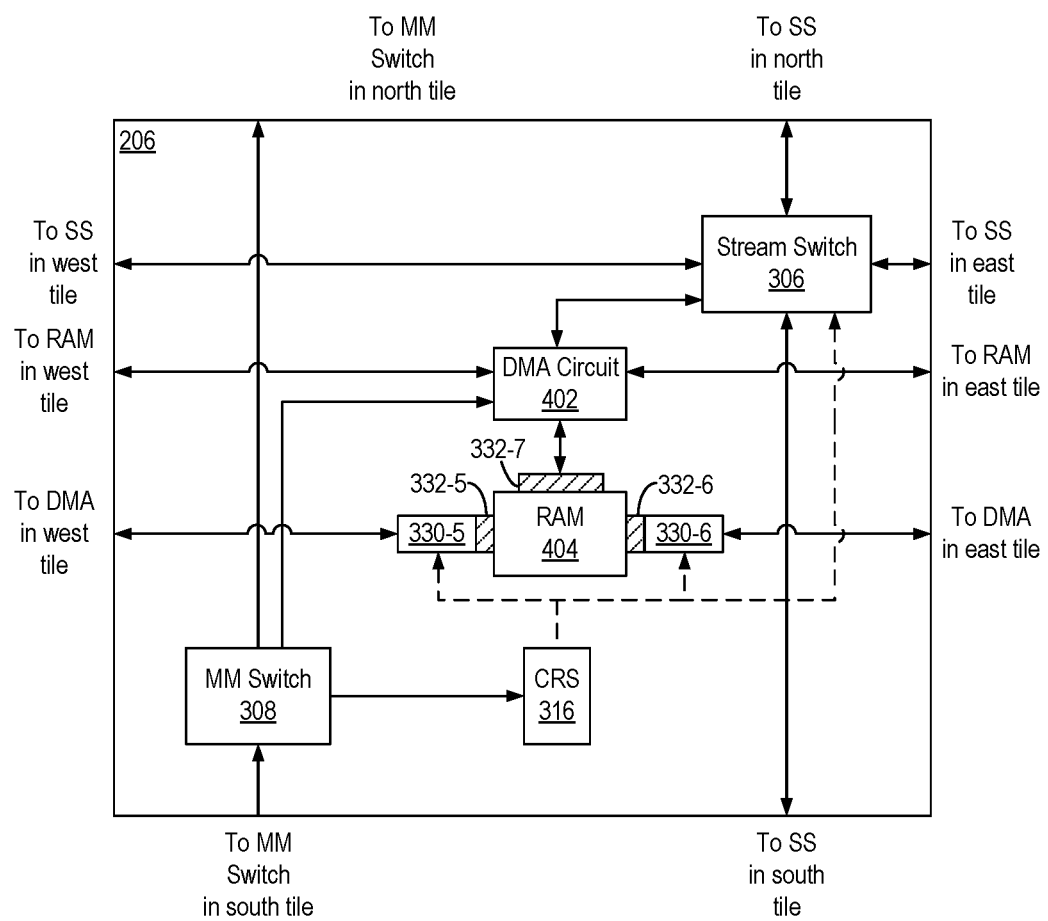
FIG. 4 illustrates an example implementation of a memory tile that is configurable to implement partition boundaries.

FIG. 4 illustrates an example implementation of a memory tile 206. The example of FIG. 4 is provided to illustrate certain architectural features of memory tiles 202 and not as a limitation of the form of DP array 102. Some connections between components and/or tiles are omitted for ease of illustration.

Each memory tile 206 includes a stream switch 306, a MM switch 308, a DMA circuit 402, a RAM 404, and CRS 316. Each DMA circuit 402 of a memory tile 206 is coupled to the RAM 404 within the same memory tile 206 via a local memory interface 332-7 and may be coupled to one or more RAMs 404 of other adjacent memory tiles 206. In the example of FIG. 4, each DMA circuit 402 is capable of accessing (e.g., reading and/or writing) the RAM 404 included within the same memory tile 206. Depending on the configuration data loaded into CRS 316 of each memory tile 206 using MM switches 308, the DMA circuit 402 of a given memory tile 204 is also capable of reading and/or writing to the RAM 404 of an adjacent memory tile 204 in the east and west adjacent memory tiles 206. For example, the DMA circuit 402 of memory tile 206-2 may access the RAM 404 of memory tile 206-1 and/or the RAM 404 of memory tile 206-3. DMA circuit 310 may place data read from RAM 404 onto stream switch 306 and write data received via stream switch to RAM 404.

In the example of FIG. 4, RAM 404 includes a local memory interface 332-7 through which the DMA circuit 402 in the same memory tile and adjacent memory interfaces 332-5 and 332-6 through which the DMA circuits of the east and west memory tiles 206 may access RAM 404. In the example, each adjacent memory interface 332-5 and 332-6 that is coupled to a DMA circuit 402 that is not located in the same memory tile 206, but rather in an adjacent or neighboring memory tile 206 includes isolation logic 330 (e.g., isolation logic 330-5 and 330-6). Isolation logic 330 may be activated by way of a control signal from control registers 316 to prevent the DMA circuit 402 coupled thereto from accessing (e.g., reading from and/or writing to) RAM 404.

For example, isolation logic 330-5 may be activated by writing configuration data to control registers 316 via memory-mapped switch 308. When activated, isolation logic 330-5 prevents the DMA circuit 402 in the west memory tile from reading from and/or writing to RAM 404 via adjacent memory interface 332-5. Isolation logic 330-6 may be activated by writing configuration data to control registers 316 via memory-mapped switch 308. When activated, isolation logic 330-6 prevents the DMA circuit 402 in the east memory tile from reading from and/or writing to RAM 404 via adjacent memory interface 332-6. It should be appreciated that each of isolation logic 330-5 and 330-6 may be controlled, e.g., activated and deactivated, independently of the other and independently of isolation logic 330-2, 330-3, and/or 330-4. By controlling which adjacent DMA circuits 402 is/are capable of accessing any given RAM 404 of a memory tile, partitions may be created that guarantee data isolation among partitions.

In the example of FIG. 4, control registers 316 may control operation of other components included in memory tile 206 such as stream switch 306. That is, configuration data may be written to control registers 316 that configures stream switch 306 of FIG. 4 to communicate with only designated tiles. Thus, though stream switch 306 may be physically connected to other stream switches in the north, south, east, and west tiles, the configuration data specifies those tiles with which stream switch 306 may establish a logical connection and, as such communicate by way of stream connections. This too establishes data isolation for a partition.

Consider an example where the memory tile of FIG. 4 is memory tile 206-2. By writing appropriate configuration data to control registers 316, DMA circuit 402 of memory tile 206-1, located in partition 230, is able to read from and/or write to RAM 404 of memory tile 206-2. The DMA circuit 402 of memory tile 206-3, being located in partition 240, is unable to read from and/or write to RAM 404 of memory tile 206-2. Similarly, stream switch 306 of memory tile 206-2 is capable of communicating with the stream switches 306 of memory tile 206-1, compute tile 202-6, and interface tile 204-2, but not with the stream switch of memory tile 206-3.

In the example of FIG. 4, the array controller 106, though not shown, is capable of writing configuration data to the control registers 316 via memory-mapped switch 308. Array controller 106 is capable of writing to control registers 316 in real-time during operation of DP array 102 to modify the settings for the isolation logic 330 (e.g., 330-4 and/or 330-5), update settings for stream switches 306, and/or change the data stored in RAMs 404.

Figure 5:
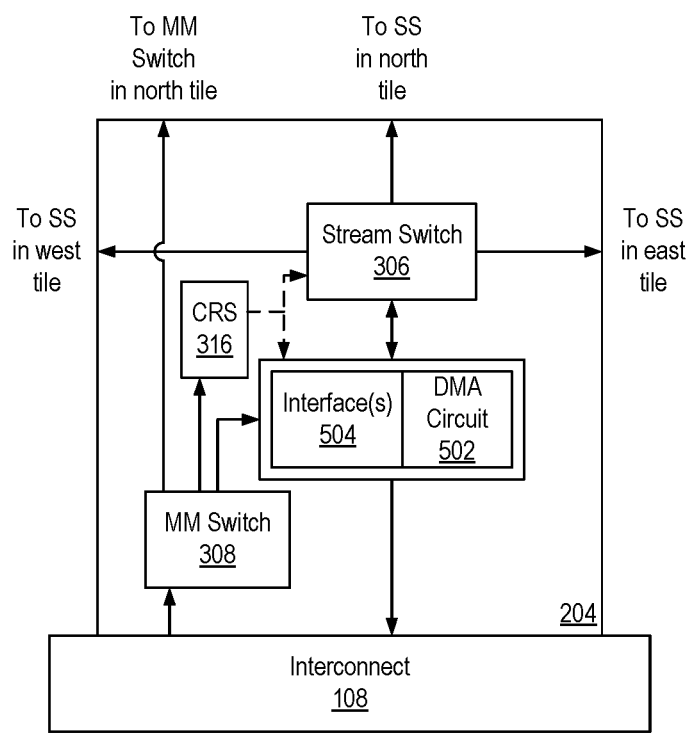
FIG. 5 illustrates an example implementation of an interface tile that is configurable to implement partition boundaries.

FIG. 5 illustrates an example implementation of an interface tile 204. The example of FIG. 5 is provided to illustrate certain architectural features of interface tiles 204 and not as a limitation of the form of DP array 102. Some connections between components and/or tiles are omitted for ease of illustration.

In the example, each interface tile 204 includes a stream switch 306, a MM switch 308, a DMA circuit 502, one or more interfaces 504, and CRS 316. In other example implementations, not every interface tile 204 includes a DMA circuit 502. Array interface 104 is operative as an interface between array tiles 204 of DP array 102 and other circuits of the IC by way of interconnect 108. In the example of FIG. 5, interface tiles 204 couple to memory tiles 206. In other example implementations, interface tiles 204 couple to compute tiles 202 depending on whether DP array 102 includes memory tiles 206 and/or the location of such memory tiles 206 within DP array 102. Through interconnect 108, interface tiles 204 are capable of coupling to one or more other circuits within the IC and/or external to the IC. Such other circuits may include one or more hardwired circuits and/or subsystems, circuits and/or subsystems implemented in programmable logic, or the like.

In the example of FIG. 5, interface(s) 504 are capable of connecting to other systems and/or circuits of the IC. For purposes of illustration, interface(s) 504 are capable of coupling to a Network-on-Chip (NoC), to programmable logic, to an embedded processor and/or processor system (independent of DP array 102), to a platform management controller embedded in the IC, and/or one or more other hardwired circuit blocks (e.g., ASIC blocks) within the IC. For example, interface 504 may include or provide direct connections to array controller 106 and/or processor 112. In another arrangement, interfaces 504 may be configured to communicate with circuits and/or systems located in the same package as DP array 102 but implemented in a different die within the package. In still another arrangement, interfaces 504 may be configured to communicate with circuits and/or systems located external to the IC that includes DP array 102 (e.g., to circuits and/or systems external to the package).

Interface tiles 204 are capable of conveying data, whether application data via stream switches 306 or configuration data via MM switches 308, to the array tiles located above each respective interface tile 204 as received via interconnect 108 and/or out to other circuits via interconnect 108. Further, interface tiles 204 are configurable by loading configuration data into CRS 316 of each respective interface tile 204 by way of MM switches 308. Array controller 106, for example, may write the configuration data to control registers 316.

Consider an example where the interface tile 204 of FIG. 5 is interface tile 204-2. By writing appropriate configuration data to control registers 316, stream switch 308 of interface tile 204-2, located in partition 230, is able to communicate with stream switch 308 of interface tile 204-1, also located in partition 230. Stream switch 308 of interface tile 204-2, being located in partition 230, is unable to communicate with stream switch 308 of interface tile 204-3, which is located in partition 240.

In the examples of FIGS. 3, 4, and 5, each stream switch 306 is connected to the stream switch of an adjacent tile. For example, each stream switch 306 is connected to the stream switch 306 of the above adjacent tile, the stream switch of the below adjacent tile, the stream switch of the left adjacent tile, and the stream switch of the right adjacent tile so long as such adjacent tiles exist in the IC. Taken collectively, stream switches 306 form a stream network that is capable of conveying application data. Application data includes data that is received, operated on, or generated (e.g., output) by an array tile of DP array 102 during runtime. Application data is generally stored, during runtime, in RAMs 304 and RAMs 404 and conveyed among stream switches 306 that have been configured to establish logical connections with each other.

In one or more other examples, the stream network is capable of conveying event information including tasks and/or jobs from processor 112 and/or array controller 106 to DP array 102 and/or to selected partitions, conveying events generated by DP array 102 and/or by selected partitions to processor 112 and/or to array controller 106 such as task or job complete events. In still other examples, an event network may be implemented within DP array 102 and array interface 104 that is independent of the stream network and the memory-mapped network described below for conveying events.

MM switches 308 are coupled vertically in columns. That is, each MM switch 308 is connected to the MM switch 308 of the above adjacent tile and the MM switch 308 of the below adjacent tile so long as such adjacent tiles exist in the IC. Taken collectively, MM switches 308 form an MM network through which configuration data may be conveyed and written to tiles.

In the examples of FIGS. 3, 4, and 5, MM switches 308 may be used to convey configuration data to the various different tiles. For purposes of illustration, processor 112 and/or array controller 106 may provide configuration data to MM switches 308 to configure tiles of DP array 102 and/or array interface 104. With reference to DP array 102 and/or array interface 104, configuration data is data that is conveyed via MM switches 308 to a tile. Configuration data may include data written to CRS 316 within the respective tiles; initialization data written to RAMs 304, 404 of a tile; program code (e.g., kernels) written to program memories 322; and tasks (e.g., jobs) written to task queues of DMA circuits 334, 402, and 502. Initialization data refers to data that is written to a memory to initialize values or set a condition at the start of operation of a component or function.

MM switches 308 may be used by a circuit with sufficient privileges to read and/or write to any memory located in DP array 102 and/or array interface 104. Configuration data loaded into CRS 316 configures the tile (e.g., one or more components of the tile) to implement particular connectivity with other tiles and/or enable/disable particular functionality of the tiles.

In one aspect, configuration data written to CRS 316 of a tile controls whether the stream switch 306 of the tile operates as a circuit-switching stream interconnect or a packet-switched stream interconnect. A circuit-switching stream interconnect is capable of implementing point-to-point, dedicated streams that are suitable for high-bandwidth communication among tiles of DP array 102. A packet-switching stream interconnect allows streams to be shared to time-multiplex multiple logical streams onto one physical stream for medium bandwidth communication. As such, stream switches 306 may be configured to implement a packet-switched stream network over which application data may be conveyed. In general, stream switches 306 are programmable to establish logical connections with other stream switches to form partitions of tiles that communicate application data during operation.

In the examples of FIGS. 6-9, though not shown, it should be appreciated that the clock signals illustrated that connect to each respective partition of DP array 102 are distributed within each respective partition to the tiles and components included therein.

Figure 6:
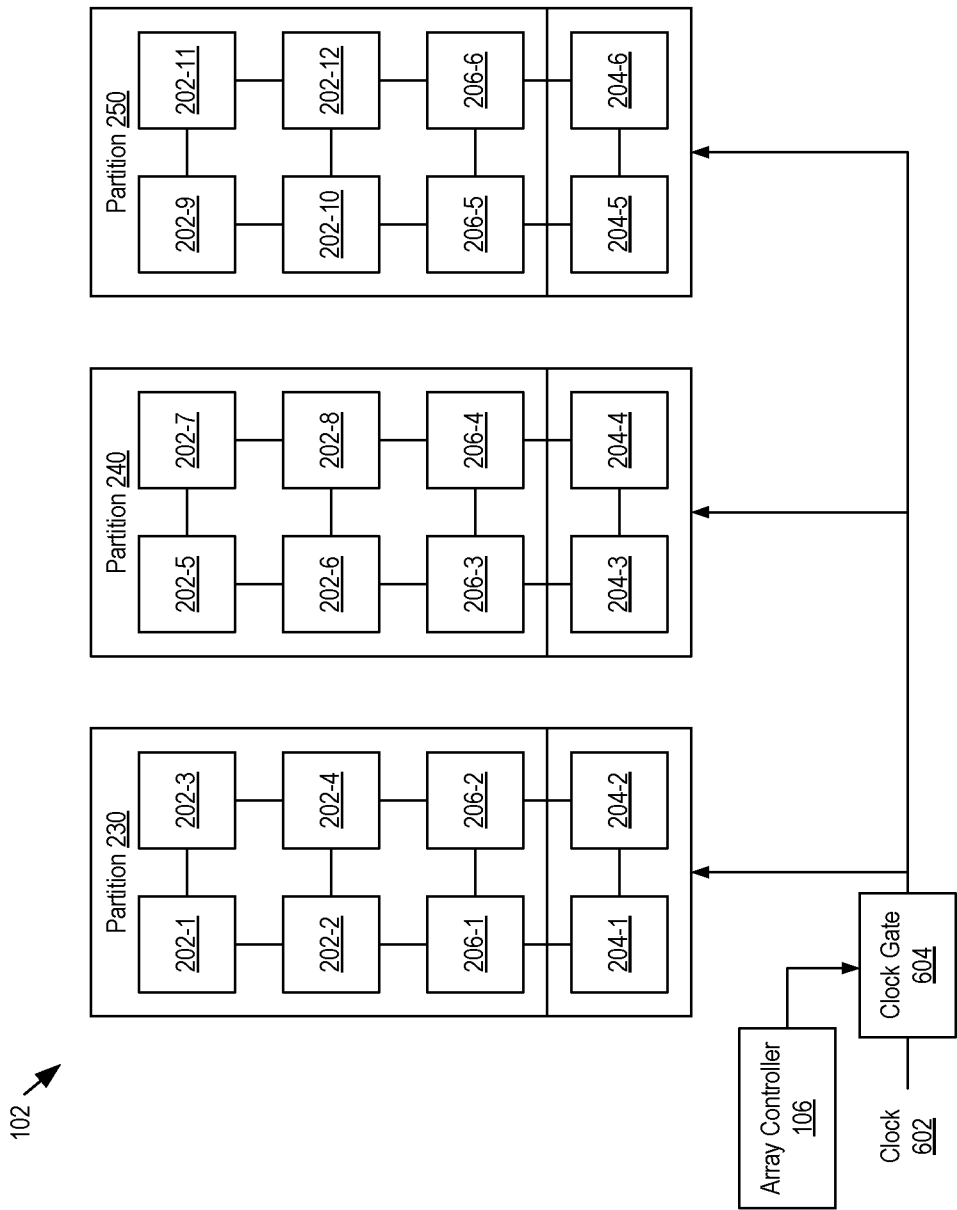
FIG. 6 illustrates an example implementation of a DP array in which the clock signal provided to the DP array may be gated during runtime.

FIG. 6 illustrates an example implementation of DP array 102 in which the clock signal provided to the DP array 102 may be gated during runtime. In the example of FIG. 6, the clocking of the entirety of DP array 102 is controllable by gating one clock signal distributed throughout the entirety of DP array 102. Thus, the clock signal provided to DP array 102 may be gated independently of other clock signals to other portions of the IC. Such other circuits, whether programmable logic, hardened circuits, other processors, and the like may continue to operate uninterrupted. The example of FIG. 6 illustrates logical connections among tiles. The logical connections among the tiles may be formed by loading configuration data into DP array 102 specifying kernels to be executed by compute tiles and other configuration data that configures stream switches and isolation logic as described in connection with FIGS. 3 and 4.

For example, the tiles of partition 230 are able to communicate with one another whether through stream switches 306, by cores 302 accessing RAMs 304 located in adjacent tiles, DMA circuits 402 accessing RAMs 404 in adjacent tiles, and/or via cascade connections directly linking processors 320 in adjacent tiles (where the contents of an internal register of one processor may be provided directly to an internal register of an adjacent processor). Similarly, the tiles of partition 240 are able to communicate with one another. Likewise, the tiles of partition 250 are able to communicate with one another. Tiles of differing partitions are unable to communicate with one another by way of the data isolation techniques described in connection with FIGS. 3, 4, and 5. As such, no logical connections exist between different partitions.

In the example of FIG. 6, each of partitions 230, 240, and 250 receives a same clock signal 602. The clock signal 602 may be gated using clock gate circuit 604, which is controlled by array controller 106. In one aspect, clock gate circuit 604 may be controlled by array controller 106 in real-time. When deactivated, clock gate circuit 604 allows clock signal 602 to pass unaltered. Thus, clock signal 602 is provided to each of partitions 230, 240, and 250 and toggles or transitions at a selected frequency. When activated, clock gate circuit 604 outputs a clock signal to the partition(s) that is static, e.g., does not toggle or transition. Thus, array controller 106 may activate and deactivate clock gate circuit 604 in real-time to selectively gate clock signal 602 as needed.

As an illustrative example, in response to determining that DP array 102 is idle, array controller 106 may, via the control signal, instruct clock gate circuit 604 to gate the clock signal 602, thereby gating the clock signal provided to the tiles of the entire DP array 102 across all partitions. The tiles will maintain state and continue to be powered on, but stop operating without a clock signal that transitions. In other examples, array controller 106 may cause clock gate circuit 604 to gate selected pulses, e.g., every other pulse, on clock signal 602 thereby reducing the frequency of the clock signal provided to DP array 102. Reducing the frequency or number of transitions per unit time results in reducing the operating frequency of the DP array 102 or throttling the frequency of the clock signal provided to DP array 102.

It should be appreciated that the example of FIG. 6 may be combined with the data isolation examples of FIGS. 2, 3, 4, and 5. That is, array controller 106 may control data isolation on a per-partition basis and clocking for the entire DP.

Figure 7:
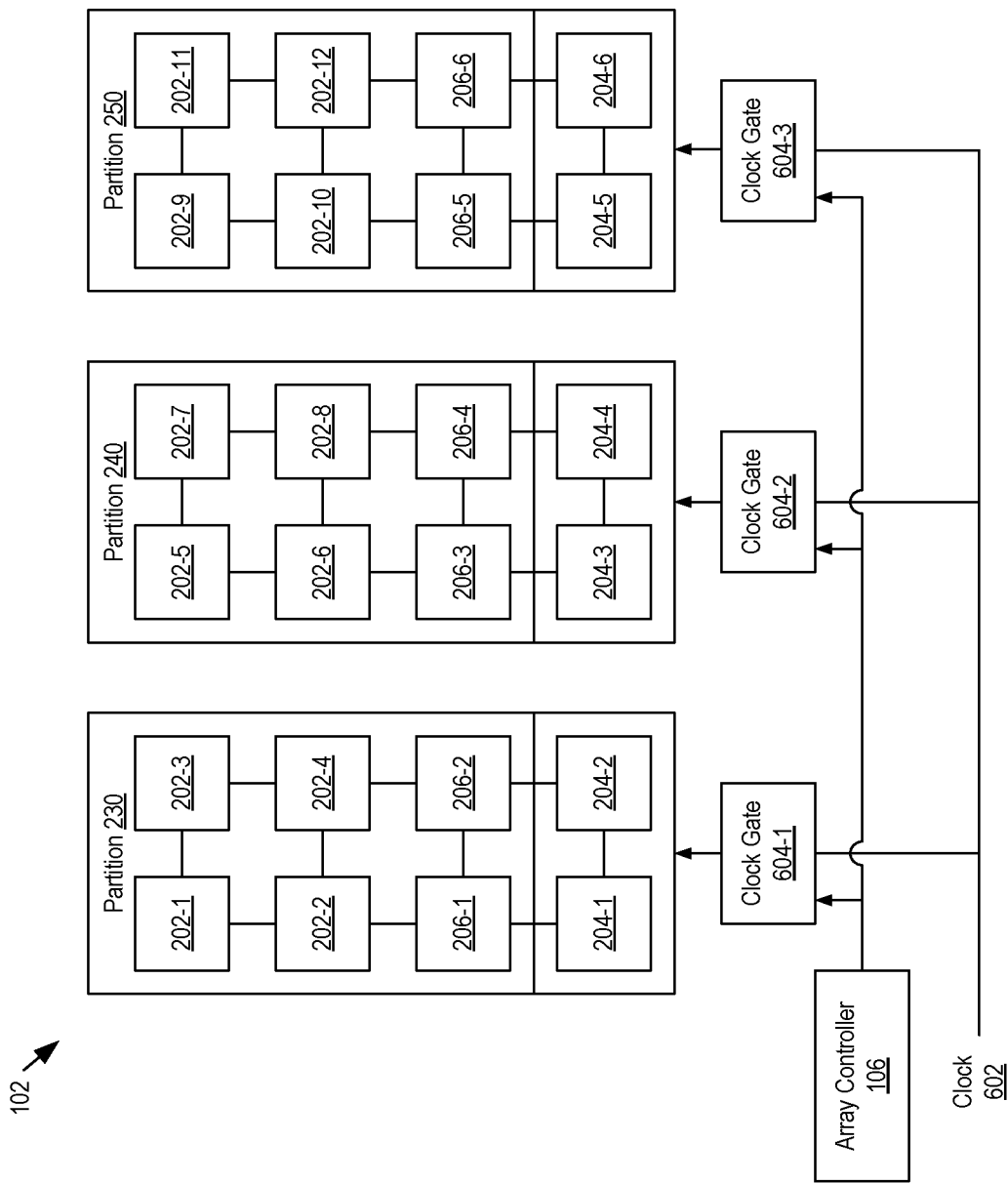
FIG. 7 illustrates another example implementation of a DP array in which the clock signal provided to each partition may be independently gated during runtime.

FIG. 7 illustrates another example implementation of DP array 102 in which the clock signal provided to each partition may be independently gated during runtime. In the example of FIG. 7, the clock gating of different partitions is independently controllable. The example of FIG. 7 is substantially similar to the example of FIG. 6 with the exception that each partition 230, 240, and 250 has a clock gate circuit 604 through which clock signal 602 is provided. Array controller 106 is operable to provide a control signal to each of clock gate circuits 604 to cause clock gate circuits 604 to gate the clock signal 602. Array controller 106 is capable of controlling each of clock gate circuits 604-1, 604-2, and 604-3 independently of the other(s) to gate clock signal 602 on a per-partition basis. Accordingly, array controller 106 is capable of gating any one or more or all of the clock signals provided to partitions 230, 240, and/or 250 in real-time. Thus, array controller 106 may gate or stop gating one or more of partitions 230, 240, and/or 250 in real-time.

As an illustrative example, in response to determining that partition 230 is idle, array controller 106 may, via the control signal, activate clock gate circuit 604-1 to gate the clock signal 602, thereby gating the clock signal provided to the tiles included in partition 230. The tiles in partition 230 will maintain state and be powered on, but stop operating without a clock signal that transitions. Partitions 240 and/or 250 may continue to operate with or without clock gating. In other examples, array controller 106 is capable of controlling clock gate circuit 604-1 to gate selected pulses, e.g., every other pulse, of clock signal 602 thereby reducing the frequency of the clock signal provided to partition 230. Reducing the frequency or number of transitions per unit time results in reducing the operating frequency of the partition 230 or throttling the frequency of the clock signal provided to partition 230. Partitions 240 and/or 250 may continue to operate with or without clock gating. Appreciably, the operations described in connection with partition 230 may be performed for other partitions.

It should be appreciated that the example of FIG. 7 may be combined with the data isolation examples of FIGS. 2, 3, 4, and 5. That is, array controller 106 may control data isolation and clocking for the entire DP and/or on a per-partition basis.

Figure 8:
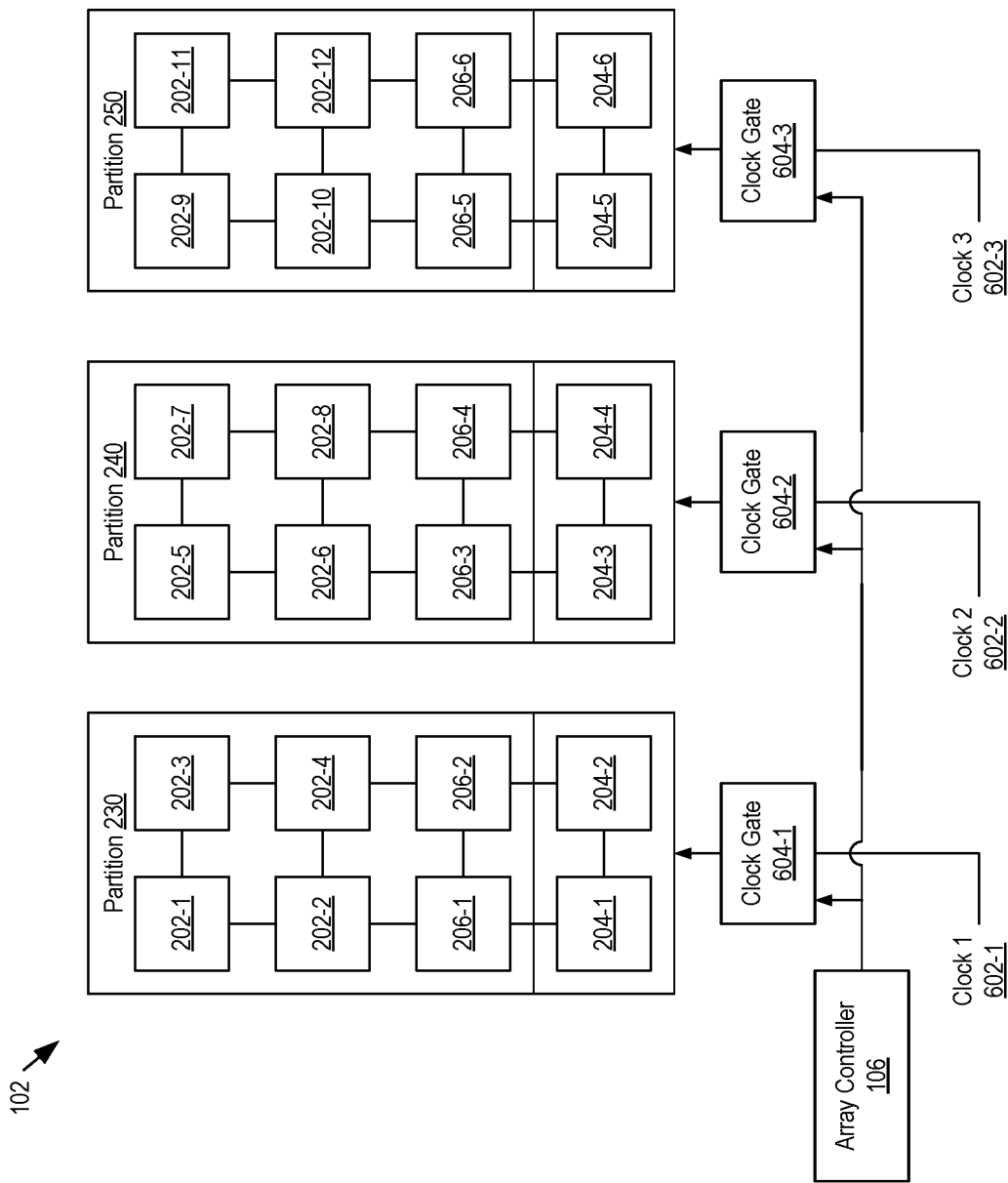
FIG. 8 illustrates another example implementation of a DP array in which different clock signals are provided to different partitions and the different clock signals may be independently gated during runtime.

FIG. 8 illustrates another example implementation of DP array 102 in which different clock signals are provided to different partitions and the different clock signals may be independently gated during runtime. The example of FIG. 8 is substantially similar to the example of FIG. 7 with the exception that a different clock signal is provided to each of clock gate circuits 604-1, 604-2, and 604-3, and, as such, to each of partitions 230, 240, and 250.

In the example of FIG. 8, not only may the clock signal provided to each partition of DP array 102 be independently gated in real-time, but because each partition 230, 240, and 250 may receive a different clock signal, each partition may be operated at a different clock frequency. That is, while the frequency of clock 1 602-1, clock 2 602-2, and clock 3 602-3 may be the same, in other examples, the clock frequencies may differ. This means that the different applications executing in each of partitions 230, 240, and/or 250 may be executed at a clock frequency that is suited to the particular application. If a particular application executing in partition 230 is not required to have a throughput as high as another application executing in a different partition, the clock frequency of partition 230 may be reduced or lowered relative to the clock frequency of partition(s) 240 and/or 250.

In the examples described herein, the frequency of each clock signal 602 may be set at the time the IC including DP array 102 is booted. That is, upon configuration of DP array 102, for example, the particular frequency of each of clock signals 602-1, 602-2, and/or 602-3 may be set.

Figure 9:
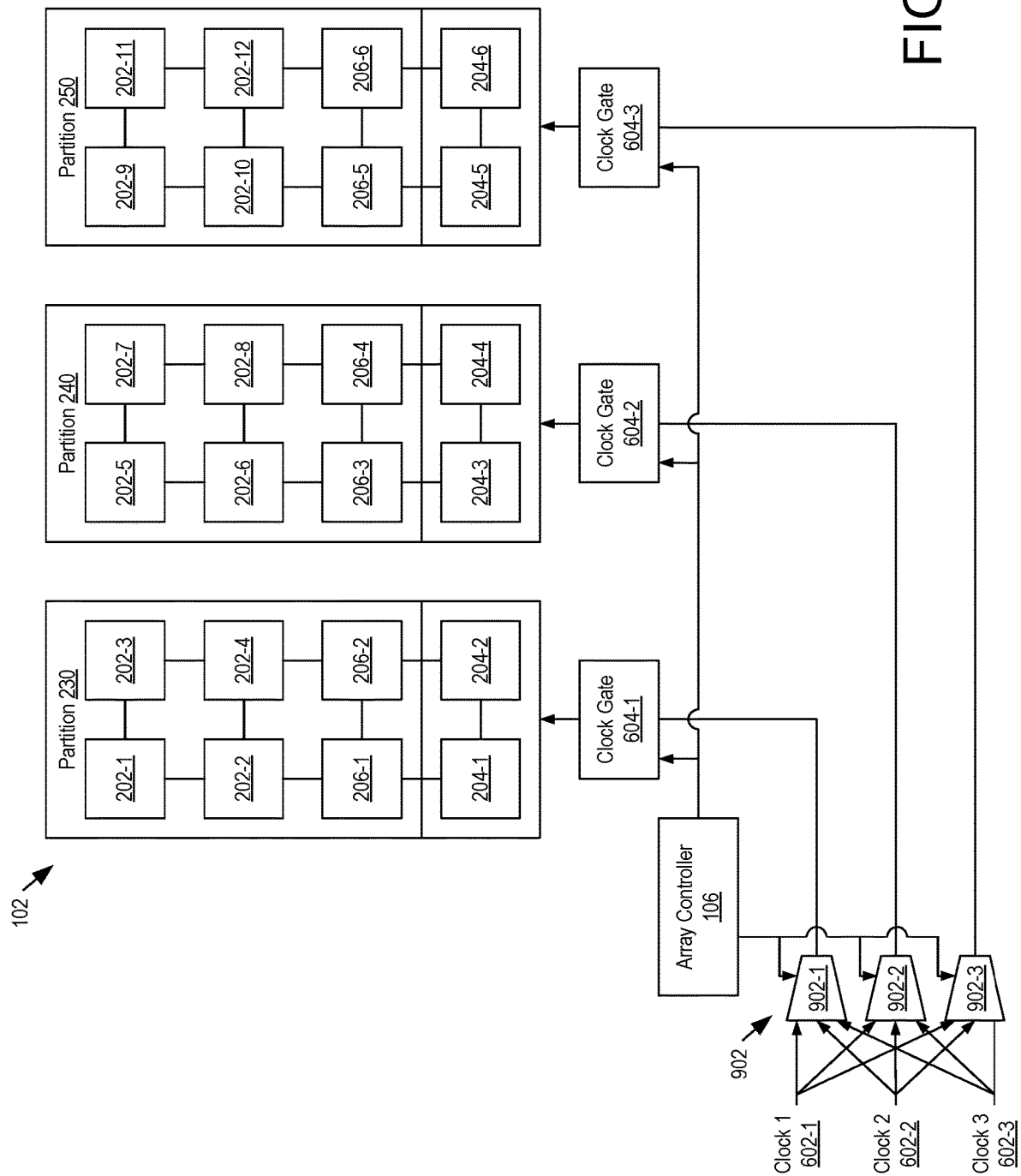
FIG. 9 illustrates another example implementation of a DP array in which the clock signals provided to the partitions may be changed during runtime and the different clock signals may be independently gated during runtime.

It should be appreciated that the example of FIG. 9 may be combined with the data isolation examples of FIGS. 2, 3, 4, and 5. That is, array controller 106 may control data isolation and clocking for the entire DP and/or on a per-partition basis.

FIG. 9 illustrates another example implementation of DP array 102 in which the clock signals provided to the partitions may be changed during runtime and the different clock signals may be independently gated during runtime. FIG. 9 illustrates another example in which partitions may be provided with different clock signals that may be changed, or switched, during runtime in real-time. The example of FIG. 9 is substantially similar to the example of FIG. 8 with the exception that switches 902 (e.g., 902-1, 902-2, and 902-3) are included that allow different ones of clock signal 1 602-1, clock signal 2 602-2, and clock signal 3 602-3 to be provided to each of clock gate circuits 604-1, 604-2, and 604-3 over time, and, as such, to each of partitions 230, 240, and 250. In addition, the particular clock signal that is passed by each respective switch 902 may be changed in real-time, e.g., at runtime of the IC and DP array 102 by way of control signals provided from array controller 106.

In the example of FIG. 9, as discussed, the frequency of clock signal 1 602-1, clock signal 2 602-2, and clock signal 3 602-3 may be the same or different depending on the configuration of DP array 102. In the case where the clock signals have different frequencies, the particular clock signal passed by one or more or each switch 902 may be changed during runtime. This means that the operating frequency of a particular application executing in a particular partition of DP array 102 may be increased or decreased depending on the particular clock signal that is passed to the partition by the corresponding switch 902. For example, an application executing in partition 230 may be operated using clock 1 602-1 by switch 902-1 passing clock 1 602-1 to partition 230, then scaled up to operate at a faster frequency corresponding to clock 2 602-2 by switch 902-1 passing clock 2 602-2 to partition 230, etc. Further, as different applications are loaded or executed by the partitions 230, 240, and/or 250 over time, each such application may be executed at a desired operating frequency corresponding to clock signal 1 602-1, clock signal 2 602-2, and/or clock signal 3 602-3.

It should be appreciated that the example of FIG. 9 may be combined with the data isolation examples of FIGS. 2, 3, 4, and 5. That is, array controller 106 may control data isolation and clocking for the entire DP and/or on a per-partition basis.

It should be appreciated that the ability to gate clock signals provided to DP array 102 and/or selected partitions thereof allows array controller 106 to reduce power consumption of the IC as well as scale processing power (e.g., operating speed) of DP array 102 and/or selected partitions thereof based on job and/or application requirements.

Figure 10:
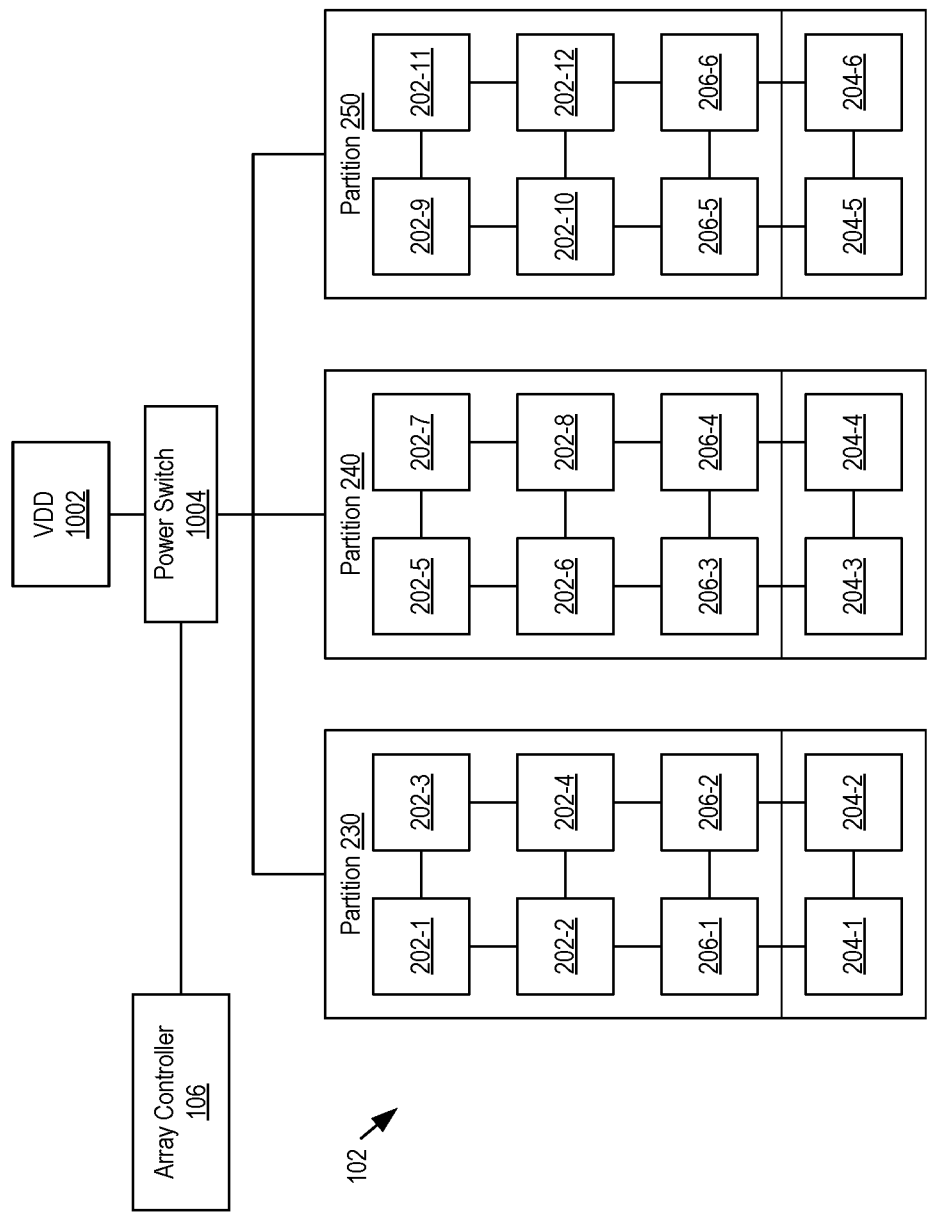
FIG. 10 illustrates an example implementation of a DP array that may be powered on and off independently of other circuits in the IC.
Figure 11:
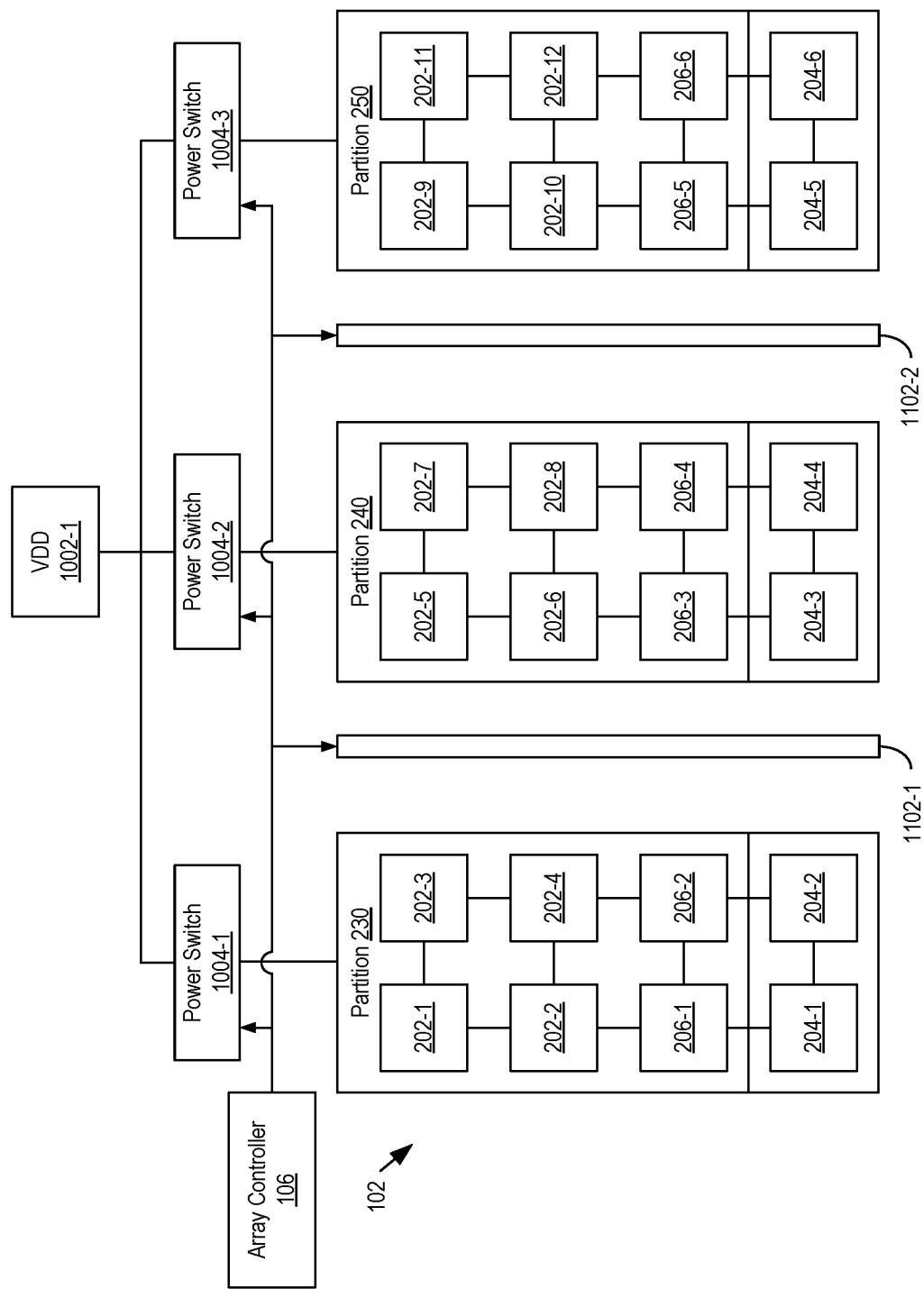
FIG. 11 illustrates another example implementation of a DP array in which power to different partitions may be managed independently.
Figure 12:
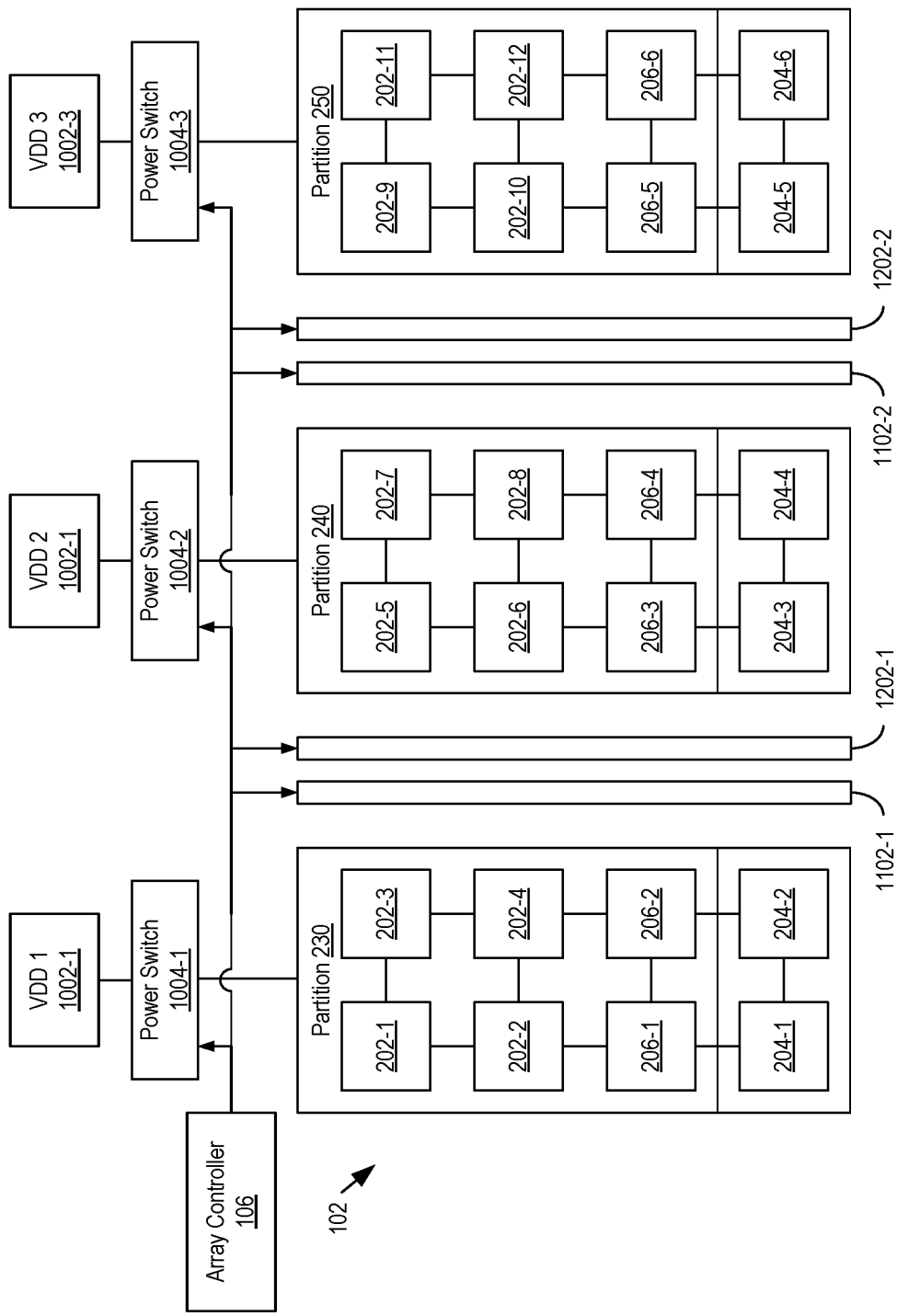
FIG. 12 illustrates another example implementation of a DP array in which power to different partitions may be managed independently.

In the examples of FIGS. 10-12, though not shown, it should be appreciated that the power (e.g., VDD) signals illustrated that connect to each respective partition of DP array 102 are distributed within each respective partition to the tiles and components included therein.

FIG. 10 illustrates an example implementation of DP array 102 that may be powered on an off independently of other circuits in the IC. In terms of partitioning for FIG. 10, DP array 102 and partitions 230, 240, and 250 may be implemented substantially as described in connection with FIG. 6. In the example of FIG. 10, DP array 102 is powered by a dedicated power source VDD 1002. Power source VDD 1002 is coupled to a power switch 1004 that is controlled by array controller 106. Power switch 1004 provides power to each of partitions 230, 240, and/or 250.

In the example of FIG. 10, each of partitions 230, 240, and 250 receives power from the same power source VDD 1002 through a single power switch 1004. In one aspect, power switch 1004 may be controlled by array controller 106 in real-time. When power switch 1004 is off, power does not flow to any of partitions 230, 240, or 250. When power switch 1004 is on, power is provided to each of partitions 230, 240, and 250.

The example of FIG. 10 allows the DP array 102 to be powered off at various times while other portions of the IC continue to operate thereby saving power without affecting other circuits within the IC. Such other circuits, whether programmable logic, hardened circuits, other processors, and the like may continue to operate uninterrupted.

It should be appreciated that the example of FIG. 10 may be combined with the data isolation examples of FIGS. 2, 3, 4, and 5, and/or with any of the clock gating examples of FIGS. 6, 7, 8, and/or 9. That is, array controller 106 may control data isolation and/or clocking for the entire DP array or on a per-partition basis and control power for the entire DP array.

FIG. 11 illustrates another example implementation of DP array 102 in which power to different partitions may be managed independently. The example of FIG. 11 is substantially similar to the example of FIG. 10 with the exception that each partition 230, 240, and 250 has a power switch 1004 through which power to the partition may be turned on and off. Array controller 106 is operable to provide a control signal to each of power switches 1004 to cause power switches 1004 to turn power on or off to the respective partition. Array controller 106 is capable of controlling each of power switches 1004-1, 1004-2, and 1004-3 independently of the other(s) to turn power on or off on a per-partition basis. Each partition effectively becomes a separate power domain or power island. Accordingly, array controller 106 is capable of turning power on or off to any partition 230, 240, and/or 250 in any combination.

In the example of FIG. 11, each partition may be separated by isolation circuitry 1102. For example, any physical signals, e.g., wires, that cross between partition 230 and partition 240 may pass through power isolation circuitry 1102-1. Similarly, any physical signals, e.g., wires, that cross between partition 240 and partition 250 may pass through power isolation circuitry 1102-2. Power isolation circuitry 1102 may be activated to prevent voltage from one partition from passing into another to electrically isolate one partition from the other thereby allowing adjacent partitions to be turned on and off independently of one another.

As an illustrative example, in response to determining that partition 230 is idle, array controller 106 may, via the control signal, turn power switch 1004-1 off, thereby removing power from partition 230 and the tiles included therein. Partitions 240 and 250 may continue to operate uninterrupted. Appreciably, the operations described in connection with partition 230 may be performed for other partitions.

It should be appreciated that the example of FIG. 11 may be combined with the data isolation examples of FIGS. 2, 3, 4, and 5, and/or with any of the clock gating examples of FIGS. 6, 7, 8, and/or 9. That is, array controller 106 may control data isolation, clocking, and/or power for the entire DP array or on a per-partition basis FIG. 12 illustrates another example implementation of DP array 102 in which power to different partitions may be managed independently. The example of FIG. 12 is substantially similar to the example of FIG. 11 with the exception that each partition 230, 240, and 250 has a different power source VDD 1002 supplying power thereto. This allows each partition to operate at a different voltage that is suited or tailored to that partition.

In the example of FIG. 12, not only may the power provided to each partition of DP array 102 be independently turned on or off in real-time, but because each partition 230, 240, and 250 is powered by a different power source VDD 1002, each partition may be operated at a different voltage. That is, while the voltage of power source VDD 1 1002-1, power source VDD 2 1002-2, and power source VDD 3 1002-3 may be the same, in other examples, the voltages may differ. This means that the different applications executing in each of partitions 230, 240, and/or 250 may execute with different voltages suited to the particular application.

In the example of FIG. 12, since each partition may be equipped with a different power supply, level shifting circuitry 1202 may also be included. In the example of FIG. 12, each partition also may be separated by level shifting circuitry 1202. For example, any physical signals, e.g., wires, that cross between partition 230 and partition 240 may pass through isolation circuitry 1102-1 and level shifting circuitry 1202-1. Similarly, any physical signals, e.g., wires, that cross between partition 240 and partition 250 may pass through isolation circuitry 1102-2 and level shifting circuitry 1202-2.

Level shifting circuitry 1202 may be activated by array controller 106 in cases where a partition boundary is not used. For example, in the case where partition 230 operates at a first voltage and partition 240 operates at a second and different voltage, but the two partitions are not used as separate partitions, but rather as one larger partition executing a single, larger application, the two portions of the DP array 102 must communicate. To do so, array controller 106 activates level shifting circuitry 1202-1, which matches voltage levels of one partition to the voltage level of the adjacent partition. That is, level shifting circuitry 1202-1 is capable of shifting voltages up and/or down to match so that the two partitions can safely communicate with one another. Similarly, isolation circuitry 1102-1 is configured to permit data to pass (such configurations may be used in the example of FIG. 11 in cases where two partitions are intended to operate as one). In cases where two or more partitions are operated as separate and independent partitions (e.g., separate applications), level shifting circuitry may be turned off by array controller 106 and isolation circuitry may be activated.

It should be appreciated that the example of FIG. 12 may be combined with the data isolation examples of FIGS. 2, 3, 4, and 5, and/or with any of the clock gating examples of FIGS. 6, 7, 8, and/or 9. That is, array controller 106 may control data isolation, clocking, and/or power for the entire DP array or on a per-partition basis.

Figure 13:
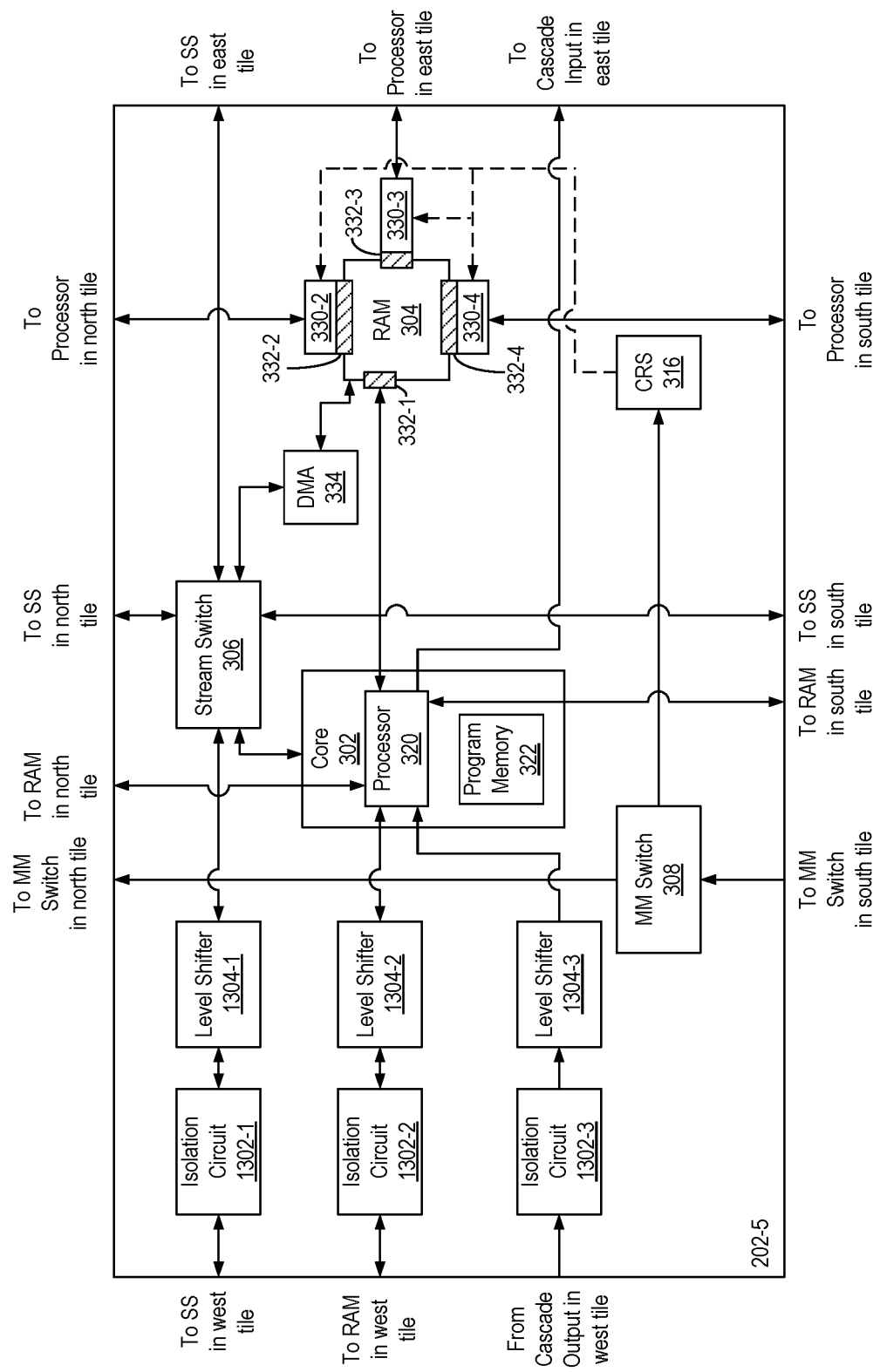
FIG. 13 illustrates another example implementation of a compute tile of a DP array.

FIG. 13 illustrates another example implementation of a compute tile 202 of DP array 102. In the example of FIG. 13, for purposes of illustration, compute tile 202-5 is illustrated. FIG. 13 illustrates example connections between different compute tiles that may pass through isolation circuits 1302 (e.g., isolation circuits 1302-1, 1302-2, and 1302-3 corresponding to isolation circuitry 1102) and level shifters 1304 (e.g., level shifters 1304-1, 1304-2, and 1304-3 corresponding to level shifting circuitry 1202).

Figure 14:
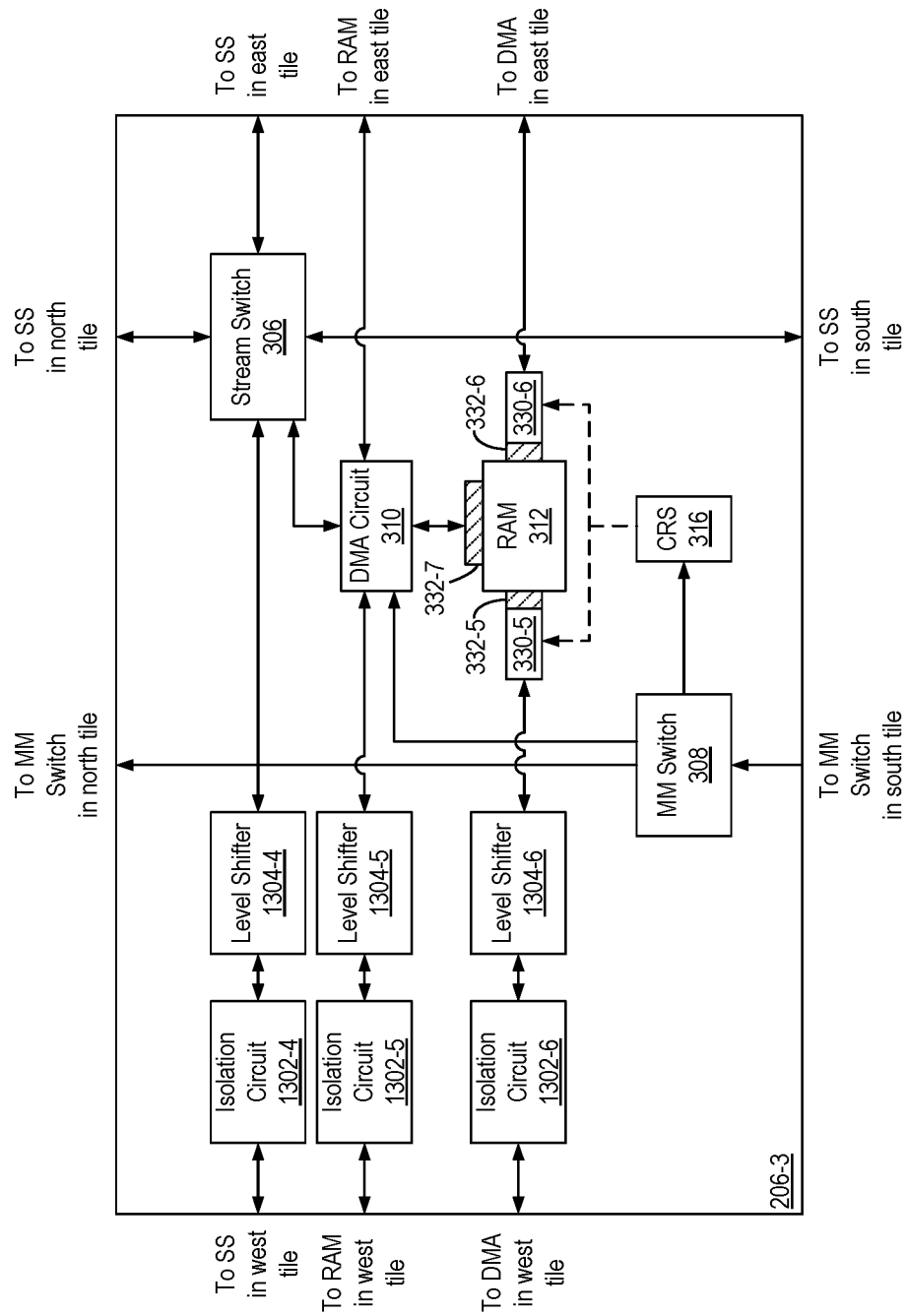
FIG. 14 illustrates another example implementation of a memory tile of a DP array.

FIG. 14 illustrates another example implementation of a memory tile 206 of DP array 102. In the example of FIG. 14, for purposes of illustration, compute tile 206-3 is illustrated. FIG. 14 illustrates example connections between different memory tiles 206 that may pass through isolation circuits 1302 (e.g., isolation circuits 1302-4, 1302-5, and 1302-6 corresponding to isolation circuitry 1102) and level shifters (e.g., level shifters 1304-4, 1304-5, and 1304-6 corresponding to level shifting circuitry 1202).

Figure 15:
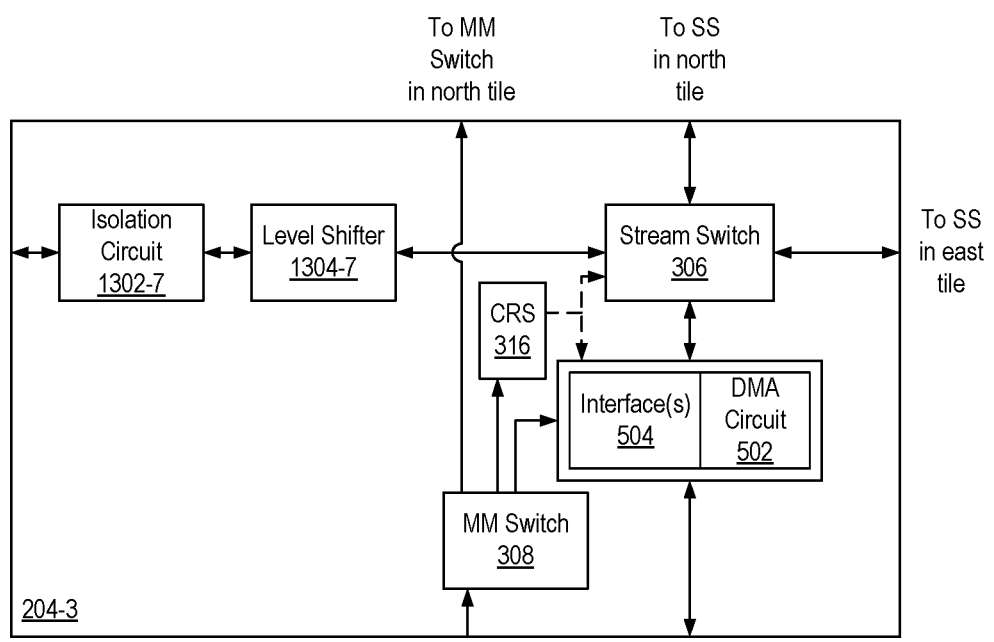
FIG. 15 illustrates another example implementation of an interface tile of a DP array.

FIG. 15 illustrates another example implementation of an interface tile 204 of DP array 102. In the example of FIG. 15, for purposes of illustration, interface tile 204-3 is illustrated. FIG. 15 illustrates example connections between different interface tiles 204 that may pass through isolation circuits 1302 (e.g., isolation circuit 1302-7 corresponding to isolation circuitry 1102) and level shifters 1304 (e.g., level shifters 1304-7 corresponding to level shifting circuitry 1202).

It should be appreciated that in the case of an example implementation corresponding to FIG. 11, level shifters 1304 may be omitted from FIGS. 13, 14, and 15.

Referring to FIGS. 11 and 12, it should be appreciated that the boundary between partitions may be fixed in terms of where the DP array 102 includes isolation circuitry 1102 and/or level shifting circuitry 1202. That is, the IC must be fabricated with such circuitry at locations where partition boundaries may be formed at least for purposes of partition-based power management. In the examples of FIGS. 11 and 12, such circuitry need only be included the column of tiles in a partition that is adjacent to tiles of another partition. For example, referring to partitions 230 and 240, such circuitry may be included in tiles 202-3, 202-4, 206-2, and 204-2 and/or included in tiles 202-5, 202-6, 206-3, and 204-3. Referring to partitions 240 and 250, such circuitry may be included in tiles 202-7, 202-8, 206-4, and 204-4 and/or included in tiles 202-9, 202-10, 206-5, and 204-5.

It should be appreciated that depending on the granularity of partitions desired for purposes of having a separate power domain per partition, e.g., partitions of 1 column, 2 columns, 3 columns or more, or varying numbers of columns, the number of tiles in which isolation circuitry 1102 and/or level shifting circuitry 1202 need be included may vary. For example, to achieve partitions of a single column, each tile may include such circuitry.

Similarly, where partitions are formed so that each partition receives a partition-specific clock signal (e.g., FIGS. 7, 8, and 9), such connections may be determined at the time of IC manufacture. Thus, partitions may be fixed. The granularity of each partition, in terms of number of columns may vary.

With respect to data isolation, partitions may be formed in any of a variety of geometric shapes and are not restricted to columns. Through configuring the isolation logic for the various RAMs and the stream switches, etc., partitions including a desired number of tiles may be created of varying shape. Further, two or more sub-partitions may be created where the sub-partitions are data-isolated from one another though such sub-partitions exist in a same clocking and/or power partition. For example, two sub-partitions (each being isolated from the other in terms of sharing data) may be implemented in partition 230 thereby allowing partition 230 to execute two (e.g., or more) applications without one application interfering with the other.

Figure 16:
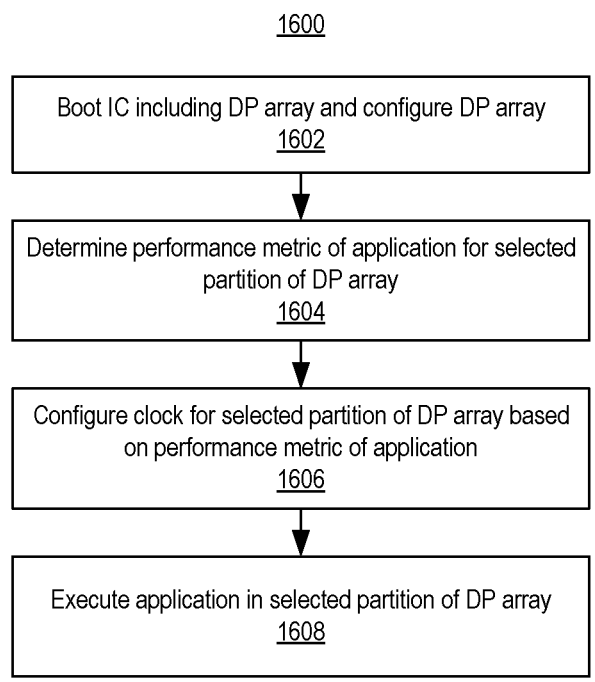
FIG. 16 illustrates an example method of operation of an electronic system including a DP array configured to operate with multiple partitions.

FIG. 16 illustrates an example method 1600 of operation of an IC including a DP array 102 configured to operate with multiple partitions. While the example of FIG. 16 is described in the context of a partition of the DP array 102, it should be appreciated that method 1800 may be performed for the DP array 102 as a whole or for more than one partition of the DP array 102.

In block 1602, the IC including DP array 102 is booted. The DP array 102 is configured. For example, as part of configuring the DP array 102, the array controller 106 is capable of loading an application into the selected partition of the DP array 102. The application can include initialization data loaded into the various memories (304, 404), configuration data that programs the stream switches 306, and program code loaded into the program memories 322 for execution by processors 320.

In block 1604, the array controller 106 is capable of determining a performance metric for the application that is loaded into the selected partition of the DP array 102. In an example, the application that is loaded, e.g., in reference to the initialization data, stream switch configuration data, and program code, may include or specify a performance metric. In another example, the particular source of the application, e.g., the processor 112 or another system, may provide a performance metric with the application. The performance metric may specify a particular clock frequency or clock frequency range (e.g., high, medium, low) that is to be used to clock the selected partition of the DP array 102 in which the application is to be executed.

In block 1606, the array controller 106 is capable of configuring the clock for the selected partition of the DP array 102 based on the performance metric of the application. In one aspect, the array controller 106 is capable of configuring the clock frequency by adjusting throttling performed by a clock gate circuit 604 for the selected partition of the DP array 102. The array controller 106 controls the throttling of the clock gate circuit 604 for the selected partition of the DP array 102 to generate a clock frequency specified by the performance metric. In another example, the array controller 106 is capable of configuring the clock frequency by selecting a particular clock signal to be passed to the selected partition in accordance with the example of FIG. 9 by programming the respective switches 902. For example, the array controller 106 may program switches 902 to pass the particular clock signal having a frequency matching or specified by the performance metric.

In block 1608, the array controller 106 is capable of executing the application in the selected partition of the DP array 102.

Figure 17:
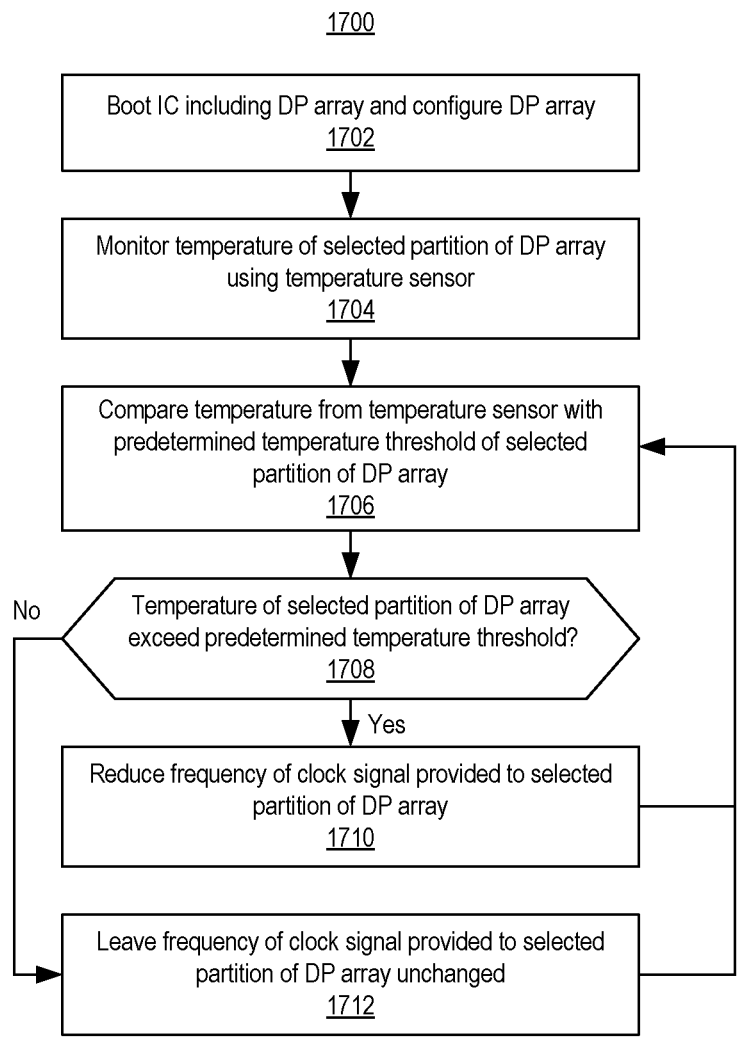
FIG. 17 illustrates another example method of operation of an electronic system including a DP array configured to operate with multiple partitions.

FIG. 17 illustrates another example method 1700 of operation of an IC including a DP array 102 configured to operate with multiple partitions. While the example of FIG. 17 is described in the context of a partition of the DP array 102, it should be appreciated that method 1800 may be performed for the DP array 102 as a whole or for more than one partition of the DP array 102.

In block 1702, the IC is booted and the DP array 102 is configured. In block 1704, the array controller 106 is capable of monitoring a temperature of a selected partition of the DP array 102 using a (e.g., one or more) temperature sensor 114. In block 1706, the array controller 106 is capable of comparing the temperature of the selected partition of the DP array 102 with a predetermined temperature threshold (e.g., corresponding to the selected partition of the DP array 102). In block 1708, the array controller 106 determines whether the temperature of the selected partition of the DP array 102, as read from the temperature sensor 114, exceeds the predetermined temperature thresholds for the selected partition of the DP array 102.

In response to determining that the temperature determined from the temperature sensor 114 exceeds the temperature threshold of the selected partition of the DP array 102, method 1700 continues to block 1710. In block 1710, the array controller 106 reduces the frequency of the clock signal provided to the selected partition of the DP array 102. The frequency may be reduced using any of the various clock control mechanisms described herein (e.g., throttling through clock gating, providing the partition with a different and lower frequency clock signal, etc.).

In response to determining that the temperature determined from the temperature sensor 114 does not exceed the temperature threshold for the selected partition of the DP array 102, method 1700 continues to block 1712. In block 1712, the array controller 106 leaves the frequency of the clock signal provided to the selected partition of the DP array 102 unchanged.

In one or more other examples, in cases where the array controller 106 has reduced the frequency of the clock signal provided to the selected partition of the DP array 102, array controller 106 may increase the frequency of the clock signal provided to the selected partition of the DP array 102 in response to determining that the temperature of the selected partition of the DP array 102 is at least a predetermined amount lower than the predetermined temperature threshold of the selected partition of the DP array 102.

In one or more other examples, the array controller 106 may increase the frequency of the clock signal provided to the selected partition of the DP array 102 in response to determining that the temperature of the selected partition of the DP array 102 is at least a predetermined amount lower than the predetermined temperature threshold of the selected partition of the DP array 102 regardless of whether the frequency of the clock signal provided to the selected partition of the DP array 102 was first reduced.

Figure 18:
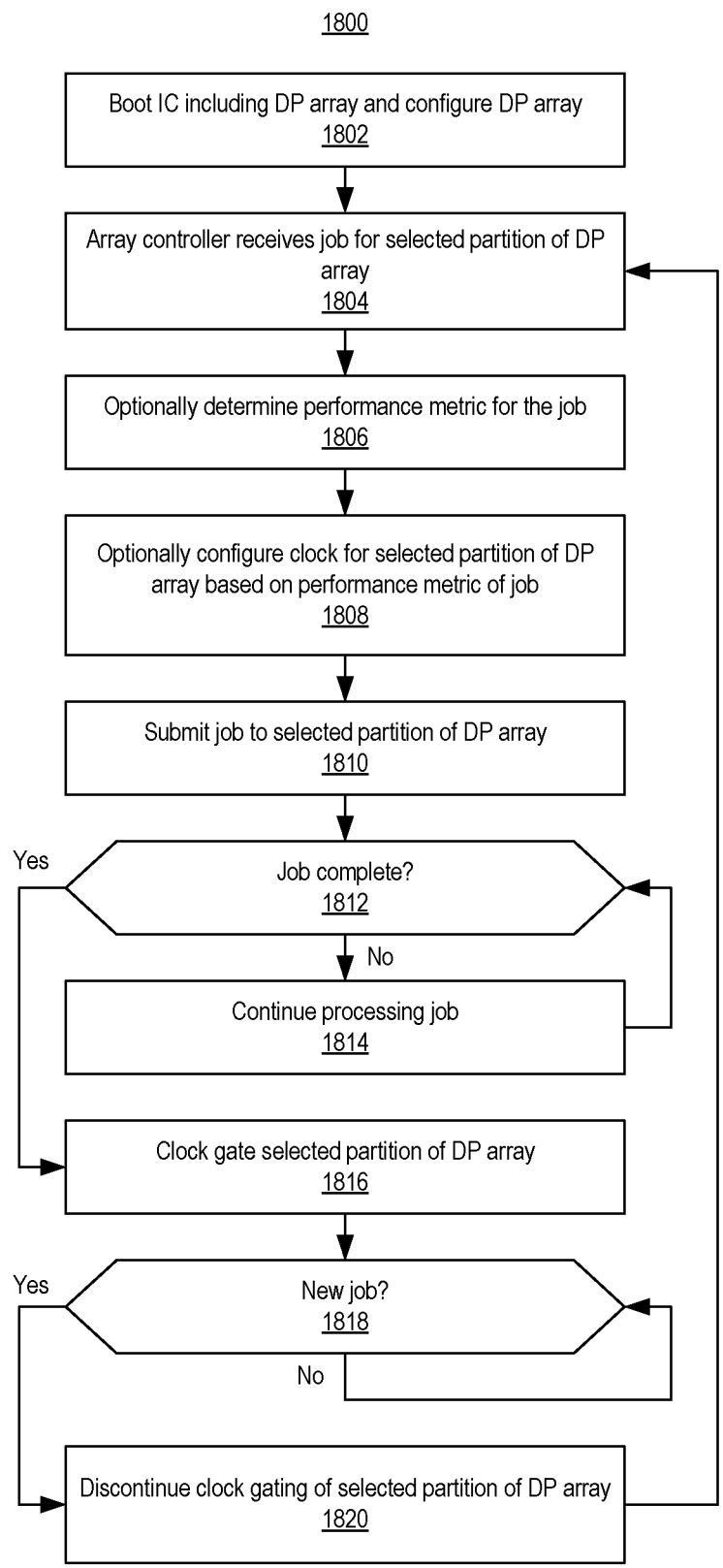
FIG. 18 illustrates another example method of operation of an electronic system including a DP array configured to operate with multiple partitions.

FIG. 18 illustrates another example method 1800 of operation of an IC including a DP array configured to operate with multiple partitions. While the example of FIG. 18 is described in the context of a partition of the DP array 102, it should be appreciated that method 1800 may be performed for the DP array 102 as a whole or for more than one partition of the DP array 102.

In block 1802, the IC is booted and the DP array 102 is configured. In block 1804, the array controller 106 receives a job for a selected partition of the DP array 102. The job may be from processor 112 or another system coupled to array controller 106. In block 1806, the array controller 106 optionally determines a performance metric for the job in cases where the job specifies or includes a performance metric. In another example, the performance metric may be provided separately from the system that provided the job. The performance metric may specify a particular clock frequency or range of clock frequency (e.g., high, medium, low) to be used to clock the selected partition. In block 1808, the array controller 106 optionally configures the clock for the selected partition based on the performance metric. The array controller configures the clock circuitry to provide a clock signal having a frequency specified or determined from the performance metric to the selected partition using any of the various clock control techniques described herein.

In block 1810, the array controller 106 is capable of submitting the job to the selected partition for processing. In block 1812, the array controller 106 is capable of determining whether the selected partition has completed the job. For example, array controller 106 may receive an event indicating that the job has been completed from the selected partition upon the selected partition completing the job. In response to the array controller 106 determining that the selected partition has not completed the job, method 1800 continues to block 1814 and continues to loop. In response to determining that the selected partition has completed the job, method 1800 continues to block 1816. In block 1816, the array controller 106 clock gates the selected partition. For example, the array controller 106 is capable of reducing the frequency of the clock signal or stopping the transitioning of the clock signal provided to the selected partition.

In block 1818, the array controller 106 is capable of monitoring for receipt of a new job as may be received from processor 112 or another system. In response to determining that a new job has not been received, method 1800 loops back to block 1818 so that the array controller 106 continues monitoring for a new job. In response to determining that a new job has been received, method 1800 may continue to block 1820. In block 1820, the array controller 106 discontinues clock gating of the selected partition. After block 1820, method 1800 loops back to block 1804 to continue processing.

In the example of FIG. 18, the job that is received may include a partition designation indicating the partition to which the job is to be directed or provided. In the example of FIG. 18, for example, the new job may be directed to the same partition that was clock gated in block 1814. In another example, the particular partition to which a job may be provided may be performed using different criteria, an example being load balancing.

Figure 19:
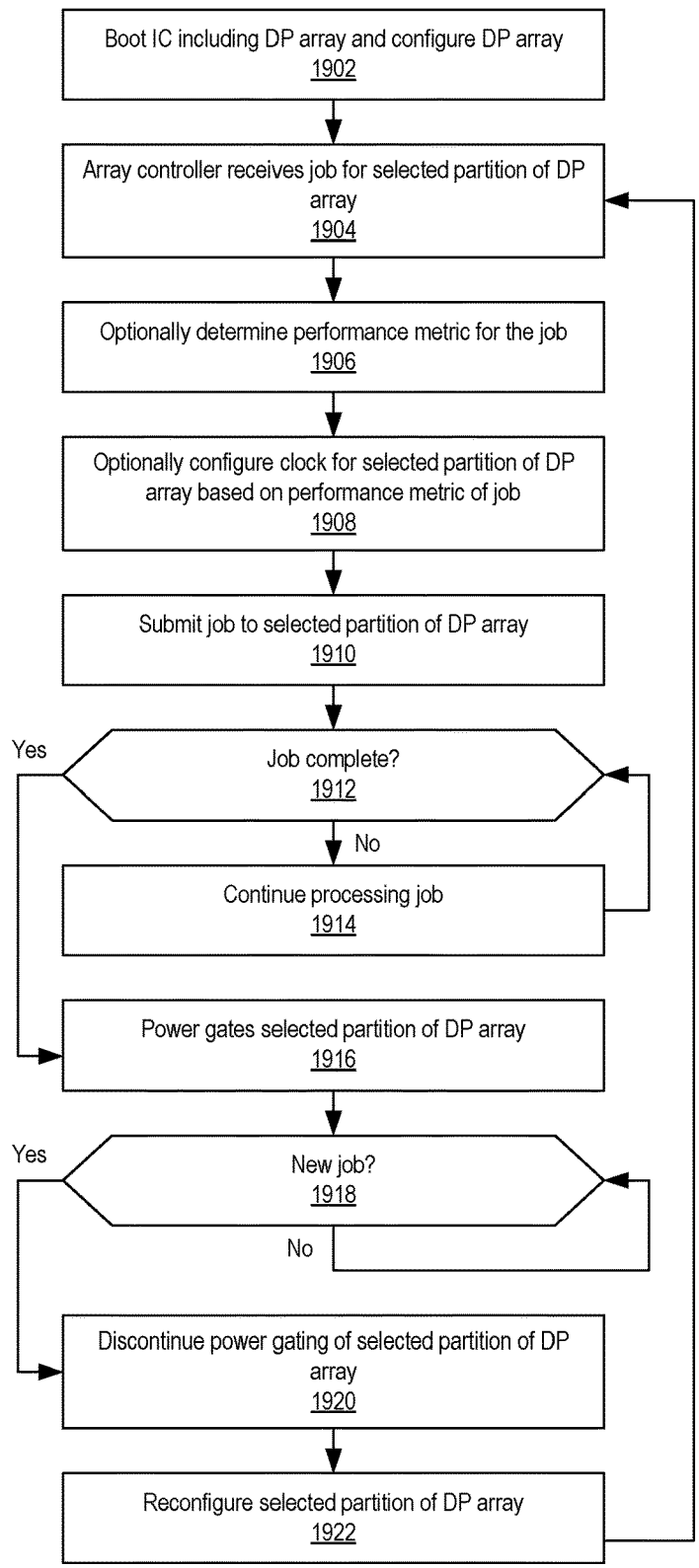
FIG. 19 illustrates another example method of operation of an electronic system including a DP array configured to operate with multiple partitions.

FIG. 19 illustrates another example method 1900 of operation of an IC including a DP array 102 configured to operate with multiple partitions. While the example of FIG. 19 is described in the context of a partition of the DP array 102, it should be appreciated that method 1900 may be performed for the DP array 102 as a whole or for more than one partition of the DP array 102.

In block 1902, the IC is booted and the DP array 102 is configured. In block 1904, the array controller 106 receives a job for a selected partition of the DP array 102. The job may be from processor 112 or another system coupled to array controller 106. In block 1906, the array controller 106 optionally determines a performance metric for the job. As noted, the job may include or specify a performance metric or be provided with an accompanying performance metric. The performance metric may specify a particular clock frequency or range of clock frequency (e.g., high, medium, low) to be used to clock the selected partition. In block 1908, the array controller 106 optionally configures the clock for the selected partition based on the performance metric. The array controller 106 is capable of configuring the clock circuitry to provide a clock signal having a frequency specified or determined from the performance metric to the selected partition using any of the various clock control techniques described herein.

In block 1910, the array controller 106 is capable of submitting the job to the selected partition for processing. In block 1912, the array controller 106 is capable of determining whether the selected partition has completed the job. For example, array controller 106 may receive an event indicating that the job has completed from the selected partition upon the selected partition completing the job. In response to the array controller 106 determining that the selected partition has not completed the job, method 1900 continues to block 1914 and continues to loop. In response to determining that the selected partition has completed the job, method 1900 continues to block 1916. In block 1916, the array controller 106 power gates the selected partition. For example, the array controller 106 is capable of turning off power to the selected partition.

In block 1918, the array controller 106 is capable of monitoring for receipt of a new job as may be received from processor 112 or another system. In response to determining that a new job has not been received, method 1900 loops back to block 1918 so that the array controller 106 continues monitoring for a new job. In response to determining that a new job has been received, method 1900 may continue to block 1920. In block 1920, the array controller 106 discontinues power gating of the selected partition, thereby restoring power to the selected partition.

In block 1922, the array controller 106 reconfigures the selected partition. For example, in response to restoring power to the selected partition, array controller 106 loads initialization data into the RAMs 304, 404 of the selected partition, programs (e.g., configures) the stream switches 306 of the selected partition, and loads program code into the program memories 322 of the selected partition. In another example, the program memories 322 may be implemented so that each of program memories 322 is capable of retaining any data stored therein when power is turned off. In that case, the array controller 106 need only initialize RAMs 304, 404 and configure stream switches 306, which requires less time. After block 1922, method 1900 may loop back to block 1904 to continue processing.

In the example of FIG. 19, the job that is received may include a partition designation indicating which partition the job is to be directed or provided. In the example of FIG. 19, for example, the new job may be directed to the same partition that was power gated. In another example, partitions may be powered off when not used and powered back on to execute a different application on an as needed basis rather than in response to a job directed to a particular partition.

While the disclosure concludes with claims defining novel features, it is believed that the various features described within this disclosure will be better understood from a consideration of the description in conjunction with the drawings. The process(es), machine(s), manufacture(s) and any variations thereof described herein are provided for purposes of illustration. Specific structural and functional details described within this disclosure are not to be interpreted as limiting, but merely as a basis for the claims and as a representative basis for teaching one skilled in the art to variously employ the features described in virtually any appropriately detailed structure. Further, the terms and phrases used within this disclosure are not intended to be limiting, but rather to provide an understandable description of the features described.

For purposes of simplicity and clarity of illustration, elements shown in the figures have not necessarily been drawn to scale. For example, the dimensions of some of the elements may be exaggerated relative to other elements for clarity. Further, where considered appropriate, reference numbers are repeated among the figures to indicate corresponding, analogous, or like features.

As defined herein, the singular forms "a," "an," and "the" are intended to include the plural forms as well, unless the context clearly indicates otherwise.

As defined herein, the terms "at least one," "one or more," and "and/or," are open-ended expressions that are both conjunctive and disjunctive in operation unless explicitly stated otherwise. For example, each of the expressions "at least one of A, B, and C," "at least one of A, B, or C," "one or more of A, B, and C," "one or more of A, B, or C," and "A, B, and/or C" means A alone, B alone, C alone, A and B together, A and C together, B and C together, or A, B and C together.

As defined herein, the term "automatically" means without human intervention. As defined herein, the term "user" means a human being.

As defined herein, the term "computer readable storage medium" means a storage medium that contains or stores program code for use by or in connection with an instruction execution system, apparatus, or device. As defined herein, a "computer readable storage medium" is not a transitory, propagating signal per se. A computer readable storage medium may be, but is not limited to, an electronic storage device, a magnetic storage device, an optical storage device, an electromagnetic storage device, a semiconductor storage device, or any suitable combination of the foregoing. The various forms of memory, as described herein, are examples of computer readable storage media. A non-exhaustive list of more specific examples of a computer readable storage medium may include: a portable computer diskette, a hard disk, a RAM, a read-only memory (ROM), an erasable programmable read-only memory (EPROM or Flash memory), an electronically erasable programmable read-only memory (EEPROM), a static random-access memory (SRAM), a portable compact disc read-only memory (CD-ROM), a digital versatile disk (DVD), a memory stick, a floppy disk, or the like.

As defined herein, the term "if" means "when" or "upon" or "in response to" or "responsive to," depending upon the context. Thus, the phrase "if it is determined" or "if [a stated condition or event] is detected" may be construed to mean "upon determining" or "in response to determining" or "upon detecting [the stated condition or event]" or "in response to detecting [the stated condition or event]" or "responsive to detecting [the stated condition or event]" depending on the context.

As defined herein, the term "responsive to" and similar language as described above, e.g., "if," "when," or "upon," means responding or reacting readily to an action or event. The response or reaction is performed automatically. Thus, if a second action is performed "responsive to" a first action, there is a causal relationship between an occurrence of the first action and an occurrence of the second action. The term "responsive to" indicates the causal relationship.

As defined herein, "data processing system" means one or more hardware systems configured to process data, each hardware system including at least one processor programmed to initiate operations and memory.

As defined herein, the term "processor" means at least one circuit capable of carrying out instructions contained in program code. The circuit may be an integrated circuit or embedded in an integrated circuit.

As defined herein, the term "output" means storing in physical memory elements, e.g., devices, writing to a display or other peripheral output device, sending or transmitting to another component, circuit, system, exporting, or the like.

As defined herein, the term "real-time" means a level of processing responsiveness that a user or system senses as sufficiently immediate for a particular process or determination to be made, or that enables the processor to keep up with some external process.

As defined herein, the term "substantially" means that the recited characteristic, parameter, or value need not be achieved exactly, but that deviations or variations, including for example, tolerances, measurement error, measurement accuracy limitations, and other factors known to those of skill in the art, may occur in amounts that do not preclude the effect the characteristic was intended to provide.

The terms first, second, etc., may be used herein to describe various elements. These elements should not be limited by these terms, as these terms are only used to distinguish one element from another unless stated otherwise or the context clearly indicates otherwise.

In some alternative implementations, the operations noted in the blocks may occur out of the order noted in the figures. For example, two blocks shown in succession may be executed substantially concurrently, or the blocks may sometimes be executed in the reverse order, depending upon the functionality involved. In other examples, blocks may be performed generally in increasing numeric order while in still other examples, one or more blocks may be performed in varying order with the results being stored and utilized in subsequent or other blocks that do not immediately follow. It will also be noted that each block of the block diagrams and/or flowchart illustration, and combinations of blocks in the block diagrams and/or flowchart illustration, may be implemented by special purpose hardware-based systems that perform the specified functions or acts or carry out combinations of special purpose hardware and computer instructions.

In one or more example implementations, an apparatus includes a DP array having a plurality of array tiles. Each array tile can include a RAM having a local memory interface accessible by circuitry within the array tile and an adjacent memory interface accessible by circuitry disposed within an adjacent array tile. Each adjacent memory interface of each array tile can include isolation logic that is programmable to prevent the circuitry disposed within the adjacent array tile from accessing the RAM via the adjacent memory interface. The DP array can be subdivided into a plurality of partitions wherein the isolation logic of the adjacent memory interfaces is programmed to prevent array tiles from accessing RAMs across a boundary between the plurality of partitions.

The foregoing and other implementations can each optionally include one or more of the following features, alone or in combination. Some example implementations include all the following features in combination.

In one aspect, a first array tile is disposed in a first partition of the plurality of partitions. The first array tile includes a first RAM and a first adjacent memory interface for the RAM. A second array tile is disposed in a second partition of the plurality of partitions. The second array tile is adjacent to the first array tile and includes a core coupled to the first adjacent memory interface. Isolation logic of the first adjacent memory interface is programmed to prevent the core from accessing the first RAM of the first array tile.

In another aspect, a first array tile is disposed in a first partition of the plurality of partitions. The first array tile includes a first RAM and a first adjacent memory interface for the RAM. A second array tile is disposed in a second partition of the plurality of partitions. The second array tile is adjacent to the first array tile and includes a DMA circuit coupled to the first adjacent memory interface. Isolation logic of the first adjacent memory interface is programmed to prevent the direct memory access circuit from accessing the first RAM of the first array tile.

In another aspect, the apparatus includes a plurality of clock gate circuits. Each clock gate circuit is programmable to selectively gate a clock signal provided to a respective one of the plurality of partitions.

In another aspect, the clock signal directed to each partition is derived from a different clock signal.

In another aspect, the apparatus include a plurality of switches. Each switch receives a plurality of different clock signals and is programmable to output a selected clock signal selected from the plurality of different clock signals to a respective one of the plurality of clock gate circuits.

In another aspect, each switch of the plurality of switches is programmable at runtime of the data processing array to output different ones of the plurality of different clock signals received by the switch.

In another aspect, each partition is a separate power domain that may be powered on and off independently of other ones of the plurality of partitions.

In another aspect, each partition has a separate and independent power source.

In another aspect, at least two of the power domains have power sources of different voltages.

In one or more example implementations, an apparatus includes a DP array having a plurality of array tiles. The plurality of array tiles include a plurality of compute tiles.

Each compute tile can include a core coupled to a RAM in a same compute tile and to a RAM of at least one other compute tile. The DP array is subdivided into a plurality of partitions. Each partition can include a plurality of array tiles including at least one of the plurality of compute tiles. The apparatus can include a plurality of clock gate circuits. Each clock gate circuit is programmable to selectively gate a clock signal provided to a respective one of the plurality of partitions.

The foregoing and other implementations can each optionally include one or more of the following features, alone or in combination. Some example implementations include all the following features in combination.

In one aspect, the clock signal directed to each partition is derived from a different clock signal.

In another aspect, the apparatus includes a plurality of switches. Each switch receives a plurality of different clock signals and is programmable to output a selected clock signal selected from the plurality of different clock signals to a respective one of the plurality of clock gate circuits.

In another aspect, each switch of the plurality of switches is programmable at runtime of the data processing array to output different ones of the plurality of different clock signals received by the switch.

In another aspect, the plurality of array tiles include a plurality of memory tiles. Each partition includes at least one of the plurality of memory tiles.

In another aspect, each partition is a separate power domain that may be powered on and off independently of other ones of the plurality of partitions.

In one or more example implementations, an apparatus includes a DP array having a plurality of array tiles. The plurality of array tiles can include a plurality of compute tiles. Each compute tile can include a core coupled to a RAM in a same compute tile and to a RAM of at least one other compute tile. The DP array can be subdivided into a plurality of partitions. Each partition can include a plurality of array tiles including at least one of the plurality of compute tiles. Each partition is a separate power domain that may be powered on and off independently of other ones of the plurality of partitions.

The foregoing and other implementations can each optionally include one or more of the following features, alone or in combination. Some example implementations include all the following features in combination.

In one aspect, each partition has a separate and independent power source.

In another aspect, at least two of the plurality of power domains have power sources of different voltages.

In another aspect, the plurality of array tiles include a plurality of memory tiles. Each partition includes at least one of the plurality of memory tiles.

What is claimed is:

1. An apparatus, comprising:
   a data processing array having a plurality of array tiles, the plurality of array tiles including a plurality of compute tiles;
   wherein each compute tile includes a core coupled to a random-access memory (RAM) in a same compute tile and to a RAM of at least one other compute tile;
   wherein the data processing array is subdivided into a plurality of partitions, each partition including a plurality of array tiles including at least one of the plurality of compute tiles; and
   a plurality of clock gate circuits, wherein each clock gate circuit is programmable to selectively gate a clock signal provided to a respective one of the plurality of partitions.

2. The apparatus of claim 1, wherein the clock signal directed to each partition is derived from a different clock signal.

3. The apparatus of claim 1, further comprising:
   a plurality of switches, wherein each switch receives a plurality of different clock signals and is programmable to output a selected clock signal selected from the plurality of different clock signals to a respective one of the plurality of clock gate circuits.

4. The apparatus of claim 3, wherein each switch of the plurality of switches is programmable at runtime of the data processing array to output different ones of the plurality of different clock signals received by the switch.

5. The apparatus of claim 1, wherein the plurality of array tiles include a plurality of memory tiles, wherein each partition includes at least one of the plurality of memory tiles.

6. The apparatus of claim 1, wherein each partition is a separate power domain that may be powered on and off independently of other ones of the plurality of partitions.

7. The apparatus of claim 1, further comprising:
   an array controller configured to control operation of the plurality of clock gate circuits at runtime of the data processing array.

8. The apparatus of claim 7, wherein the array controller is configured to cause at least one of the clock gate circuits of the plurality of clock gate circuits to gate the clock signal provided from the at least one of the clock gate circuits to a respective one of the plurality of partitions in response to the respective one of the plurality of partitions being idle.

9. The apparatus of claim 7, wherein the array controller is configured to cause at least one of the clock gate circuits of the plurality of clock gate circuits to reduce a frequency of the clock signal provided from the at least one of the clock gate circuits to a respective one of the plurality of partitions.

10. The apparatus of claim 4, wherein each clock signal of the plurality of different clock signals has a different frequency.

11. The apparatus of claim 1, further comprising:
    a temperature sensor configured to output a temperature reading at runtime; and
    an array controller configured to control clock gating for one or more of the plurality of partitions of the data processing array responsive to a comparison of the temperature reading with a temperature threshold.

* * * * *